United States Patent
Yu et al.

(10) Patent No.: US 12,040,382 B2
(45) Date of Patent: Jul. 16, 2024

(54) METHOD OF FORMING A NANO-FET SEMICONDUCTOR DEVICE

(71) Applicant: Taiwan Semiconductor Manufacturing Co., Ltd., Hsinchu (TW)

(72) Inventors: Li-Chi Yu, Jhubei (TW); Cheng-I Chu, Hsinchu (TW); Chen-Fong Tsai, Hsinchu (TW); Yi-Rui Chen, Hsinchu (TW); Sen-Hong Syue, Zhubei (TW); Wen-Kai Lin, Yilan (TW); Yoh-Rong Liu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 355 days.

(21) Appl. No.: 17/322,405

(22) Filed: May 17, 2021

(65) Prior Publication Data
US 2022/0262925 A1    Aug. 18, 2022

Related U.S. Application Data

(60) Provisional application No. 63/148,646, filed on Feb. 12, 2021.

(51) Int. Cl.
*H01L 29/66* (2006.01)
*H01L 21/02* (2006.01)
(Continued)

(52) U.S. Cl.
CPC .. *H01L 29/66553* (2013.01); *H01L 21/02236* (2013.01); *H01L 21/0259* (2013.01);
(Continued)

(58) Field of Classification Search
CPC ......... H01L 29/66553; H01L 21/02236; H01L 21/0259; H01L 21/28518; H01L 21/30604; H01L 21/823807; H01L 21/823814; H01L 21/823828; H01L 21/823864; H01L 21/823871; H01L 27/092; H01L 29/0665;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

CN   109216197 A   1/2019
CN   109427901 A   3/2019
(Continued)

*Primary Examiner* — Kimberly N Rizkallah
*Assistant Examiner* — Zhijun Xu
(74) *Attorney, Agent, or Firm* — Slater Matsil, LLP

(57) ABSTRACT

Embodiments include nanostructure devices and methods of forming nanostructure devices which include a treatment process to expand a sidewall spacer material to close a seam in the sidewall spacer material after deposition. The treatment process includes oxidation anneal and heat anneal to expand the sidewall spacer material and crosslink the open seam to form a closed seam, lower k-value, and decrease density.

20 Claims, 54 Drawing Sheets

(51) Int. Cl.
*H01L 21/285* (2006.01)
*H01L 21/306* (2006.01)
*H01L 21/8238* (2006.01)
*H01L 27/092* (2006.01)
*H01L 29/06* (2006.01)
*H01L 29/417* (2006.01)
*H01L 29/423* (2006.01)
*H01L 29/45* (2006.01)
*H01L 29/786* (2006.01)

(52) U.S. Cl.
CPC .. *H01L 21/28518* (2013.01); *H01L 21/30604* (2013.01); *H01L 21/823807* (2013.01); *H01L 21/823814* (2013.01); *H01L 21/823828* (2013.01); *H01L 21/823864* (2013.01); *H01L 21/823871* (2013.01); *H01L 27/092* (2013.01); *H01L 29/0665* (2013.01); *H01L 29/41733* (2013.01); *H01L 29/42392* (2013.01); *H01L 29/45* (2013.01); *H01L 29/66545* (2013.01); *H01L 29/66636* (2013.01); *H01L 29/66742* (2013.01); *H01L 29/78618* (2013.01); *H01L 29/78696* (2013.01)

(58) Field of Classification Search
CPC ......... H01L 29/41733; H01L 29/42392; H01L 29/45; H01L 29/66545; H01L 29/66636; H01L 29/66742; H01L 29/78618; H01L 29/78696; H01L 29/0673; H01L 29/66439; H01L 29/0847; H01L 29/165; H01L 29/7848; H01L 21/02326; H01L 21/02337; H01L 21/3115; H01L 29/775; H01L 21/3105; H01L 27/0924; H01L 21/823821; H01L 21/823878; H01L 21/823857; H01L 29/4983; B82Y 10/00
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2016/0071757 | A1* | 3/2016 | Tsai .................. H01L 29/0649 438/400 |
| 2019/0006485 | A1 | 1/2019 | Kim et al. |
| 2019/0067122 | A1 | 2/2019 | Cheng et al. |
| 2020/0075743 | A1 | 3/2020 | Lee et al. |
| 2020/0185539 | A1* | 6/2020 | Lee .................. H01L 29/42376 |
| 2020/0411661 | A1 | 12/2020 | Guler et al. |
| 2022/0123152 | A1 | 4/2022 | Abhijith et al. |
| 2022/0336637 | A1 | 10/2022 | Kao et al. |

FOREIGN PATENT DOCUMENTS

| | | |
|---|---|---|
| DE | 102017119616 A1 | 11/2018 |
| DE | 102020113776 A1 | 12/2020 |
| KR | 20030052663 A | 6/2003 |
| KR | 20190002005 A | 1/2019 |
| KR | 20190024625 A | 3/2019 |

\* cited by examiner

METHOD OF FORMING A NANO-FET SEMICONDUCTOR DEVICE

PRIORITY CLAIM AND CROSS-REFERENCE

This patent application claims priority to U.S. Provisional Application No. 63/148,646, filed on Feb. 12, 2021, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
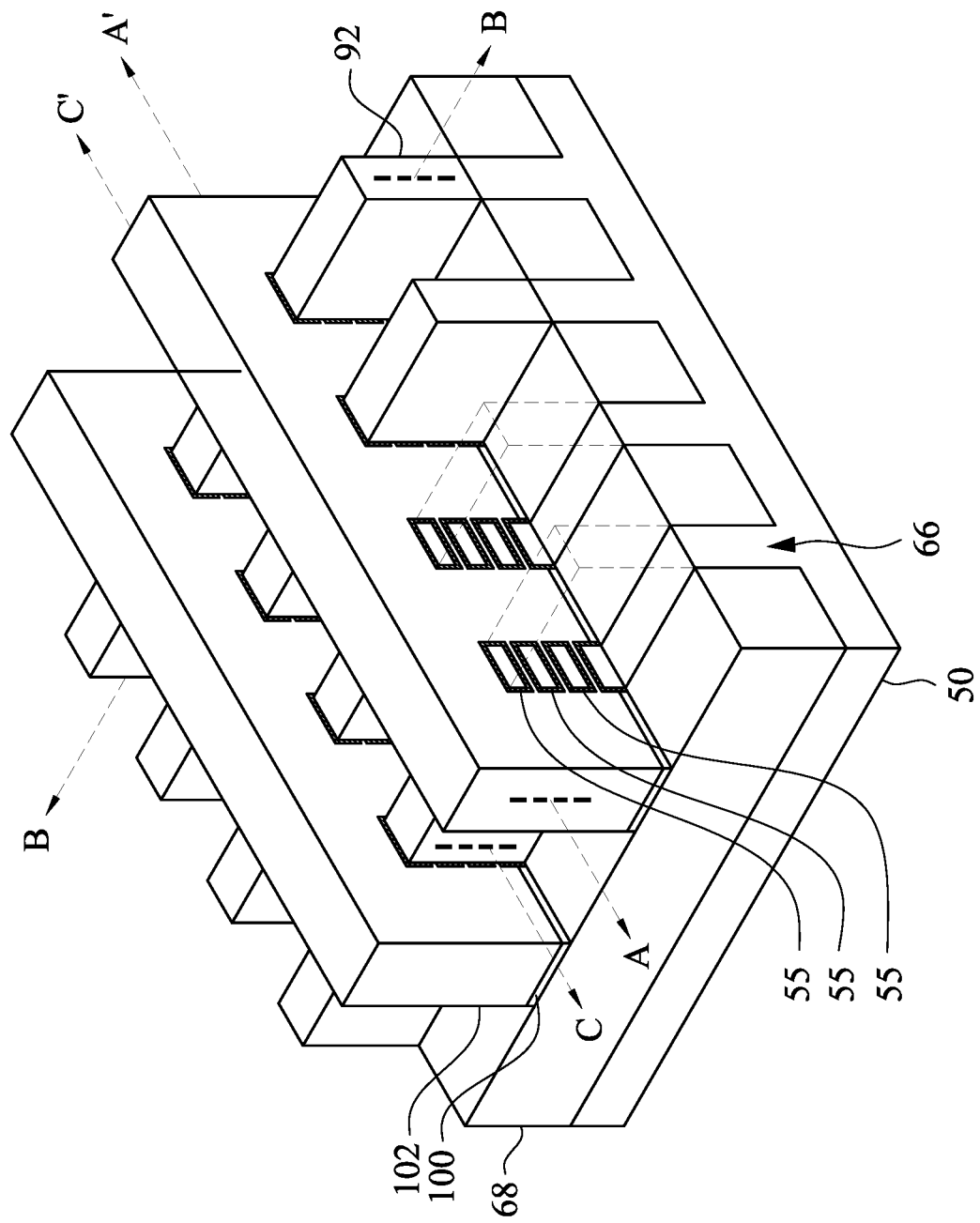
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

Embodiments of the present disclosure advantageously perform a process to a sidewall spacer of a nano-FET to reduce or eliminate a seam that can form in the spacer and to reduce or eliminate dishing of the sidewall spacer. In the formation of nano-FETs, sidewall spacers may be used between the source/drain epitaxial regions and the gate structures. After recesses are formed for the source/drain epitaxial regions, the nanostructures are etched laterally to recess the sides of the nanostructures. This etching can cause dishing of the nanostructure sidewall recesses. Then, a spacer is deposited in the sidewall recesses. In some cases, when the spacer is deposited, a seam may occur between the top of the spacer and the bottom of the spacer due to the dishing of the sidewall recesses. Embodiments advantageously process the spacer to reduce or eliminate the seam and to reduce or eliminate the dishing of the sidewall spacer. As a result $C_{eff}$ of the transistor is improved and an AC performance boost is realized.

FIG. 1 illustrates an example of nano-FETs (e.g., nanowire FETs, nanosheet FETs (NSFETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 26C are cross-sectional views of intermediate stages in the manufacturing of nano-FETs, in accordance with some embodiments. FIGS. 2 through 5, 6A, 19A, 20A, 21A, 22A, 23A, 24A, 25A, 26A, and 27A illustrate reference cross-section A-A' illustrated in FIG. 1. FIGS. 6B, 7B, 8B, 9B, 10B, 10C, 11B, 11C, 12B, 12C, 13A, 13B, 13C, 13D, 14A, 14B, 15, 16, 17B, 18B, 19B, 20B, 21B, 22B, 23B, 24B, 25B, 26B, and 27B illustrate reference cross-section B-B' illustrated in FIG. 1. FIGS. 7A, 8A, 9A, 10A, 11A, 12A, 17A, 18A, 18C, 19C, 24C, 25C, 26C, and 27C illustrate reference cross-section C-C' illustrated in FIG. 1. FIGS. 27A, 27B, and 27C are cross-sectional views of nano-FETs, in accordance with some embodiments.

Figure 2:
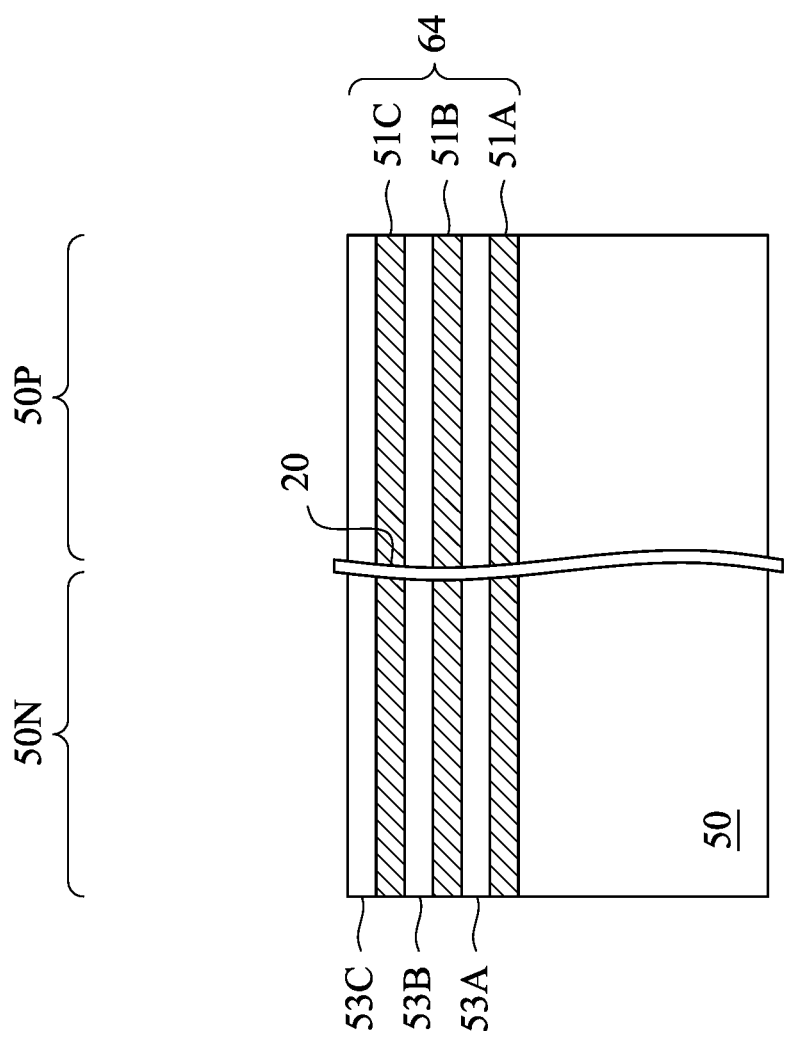
FIGS. 2, 3, 4, 5, 6A, 6B, 7A, 7B, 8A, 8B, 9A, 9B, 10A, 10B, 10C, 11A, 11B, 11C, 12A, 12B, 12C, 13A, 13B, 13C, 13D, 14A, 14B, 15, 16, 17A, 17B, 18A, 18B, 18C, 19A, 19B, 19C, 20A, 20B, 21A, 21B, 22A, 22B, 23A, 23B, 24A, 24B, 24C, 25A, 25B, 25C, 26A, 26B, and 26C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 27A, 27B, and 27C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
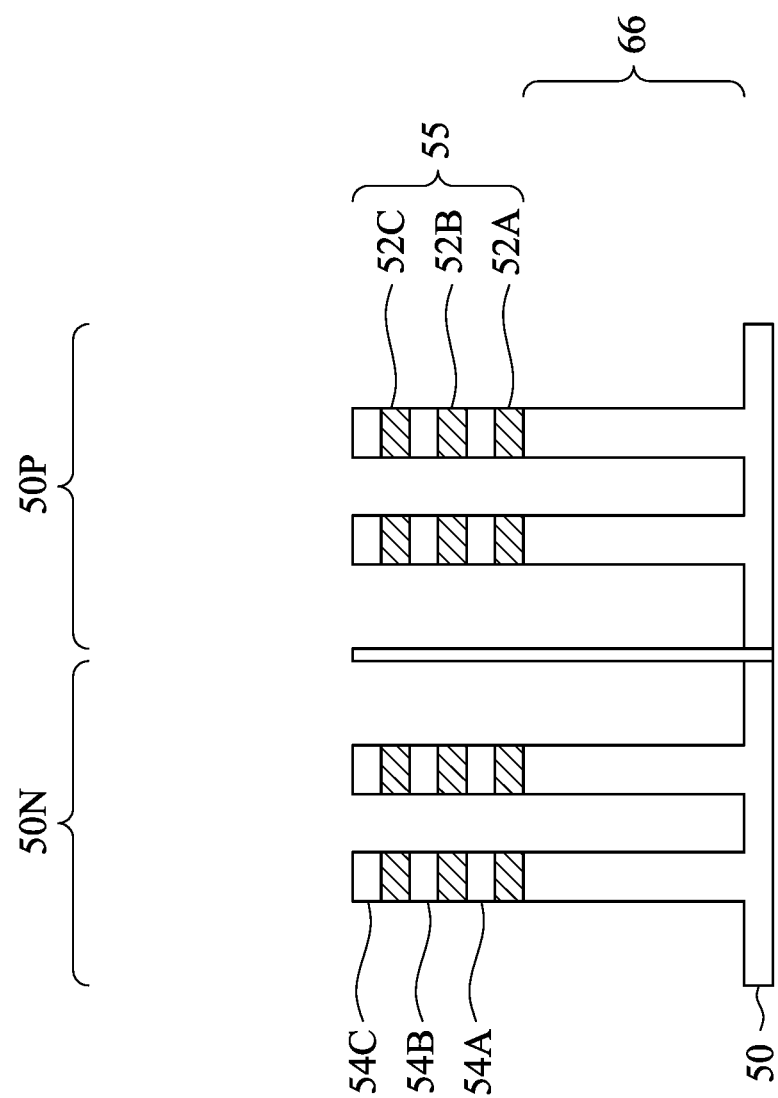

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
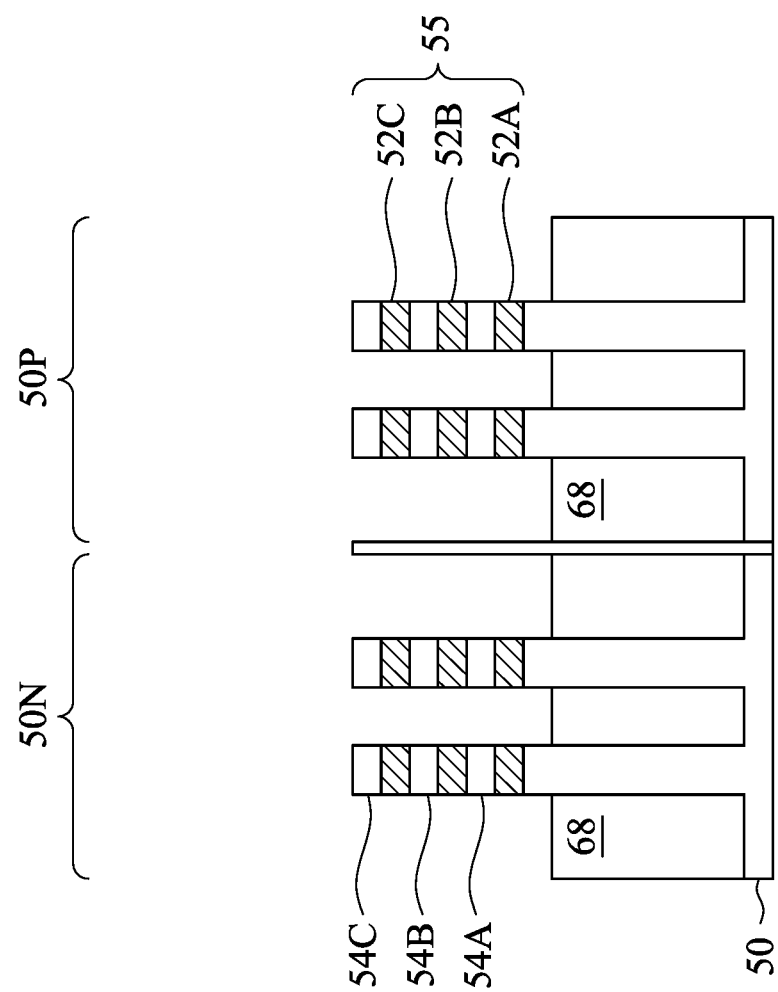

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
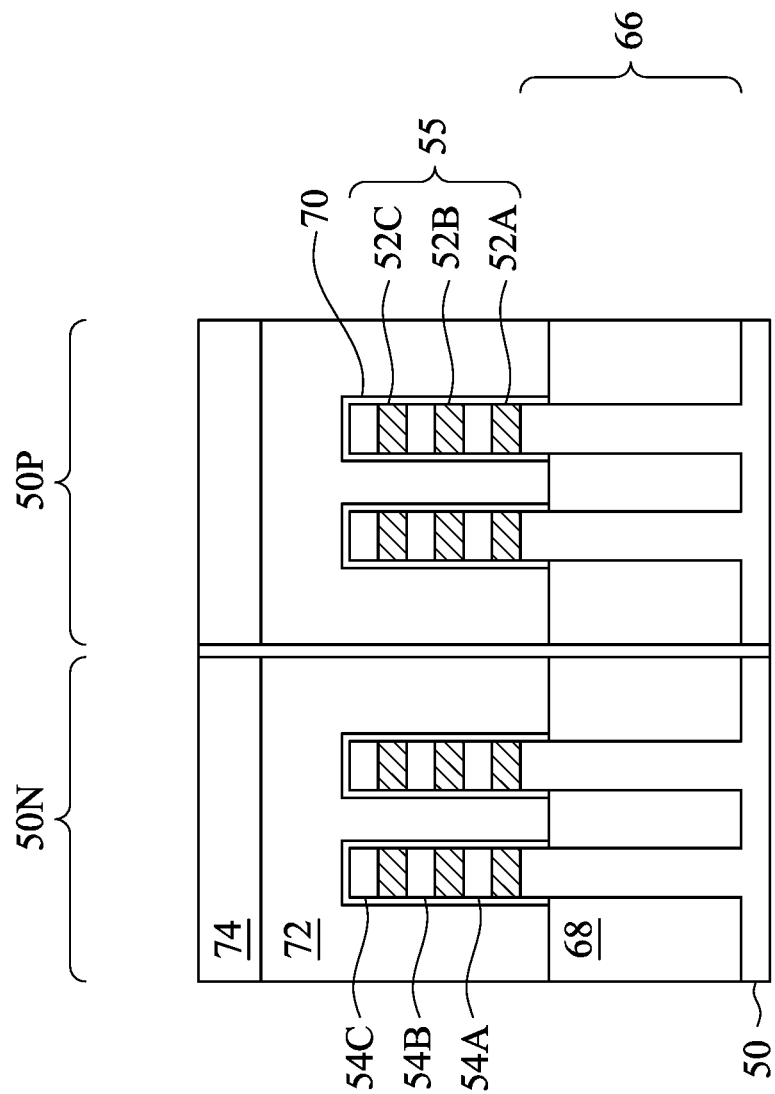

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
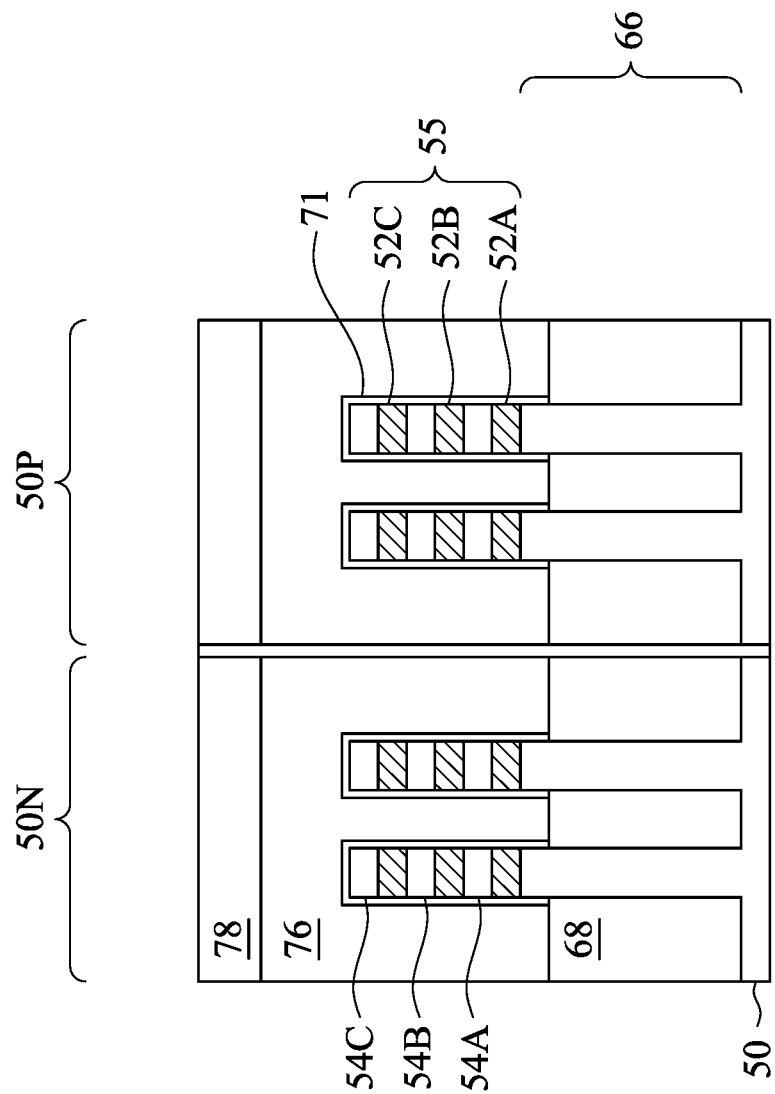
Figure 6B:
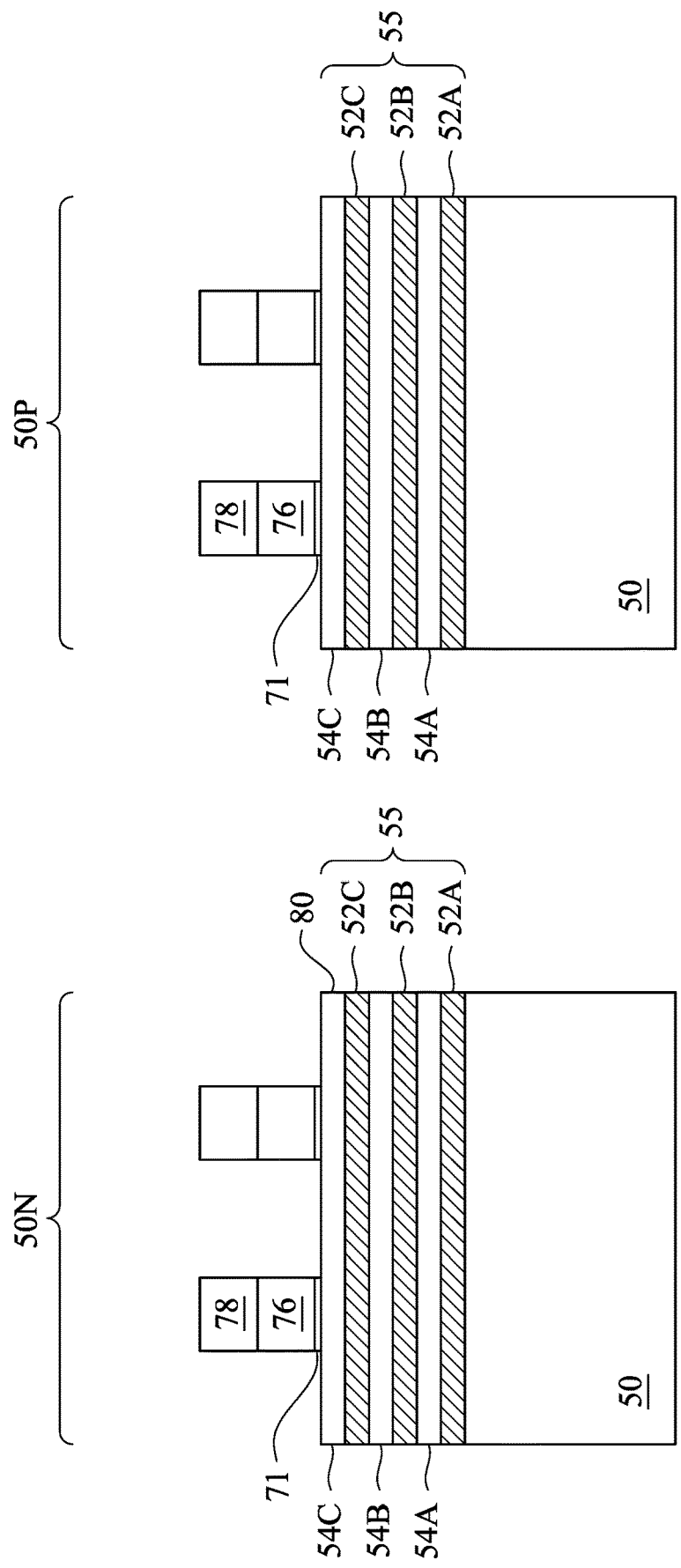

FIGS. 6A through 18C illustrate various additional steps in the manufacturing of embodiment devices. FIGS. 6A, 7A, 8A, 9A, 10A, 11A, 12A, 12C, 13A, 13C, 14A, 15A, and 18C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
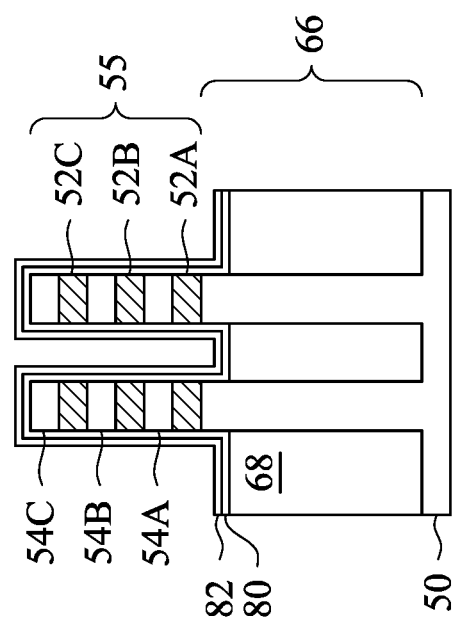
Figure 7B:
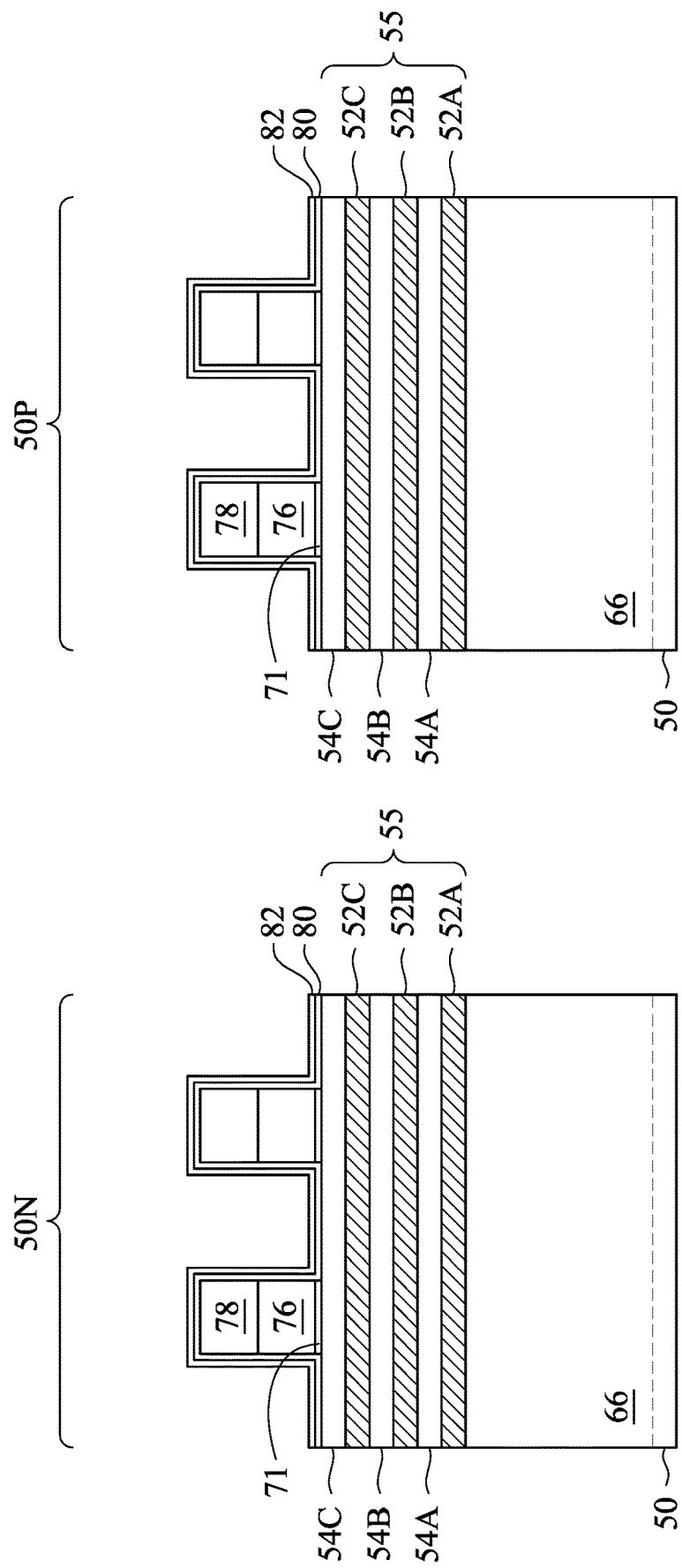

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
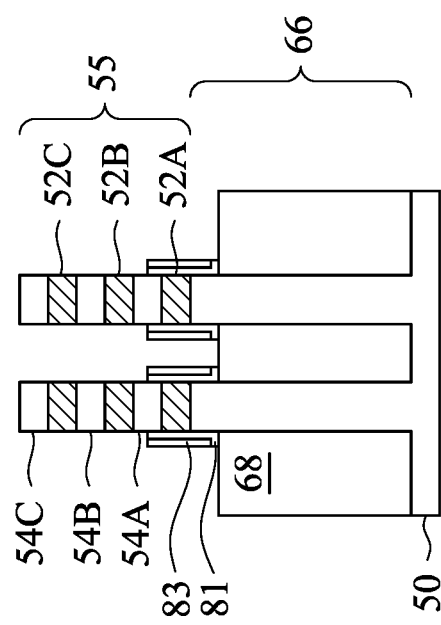
Figure 8B:
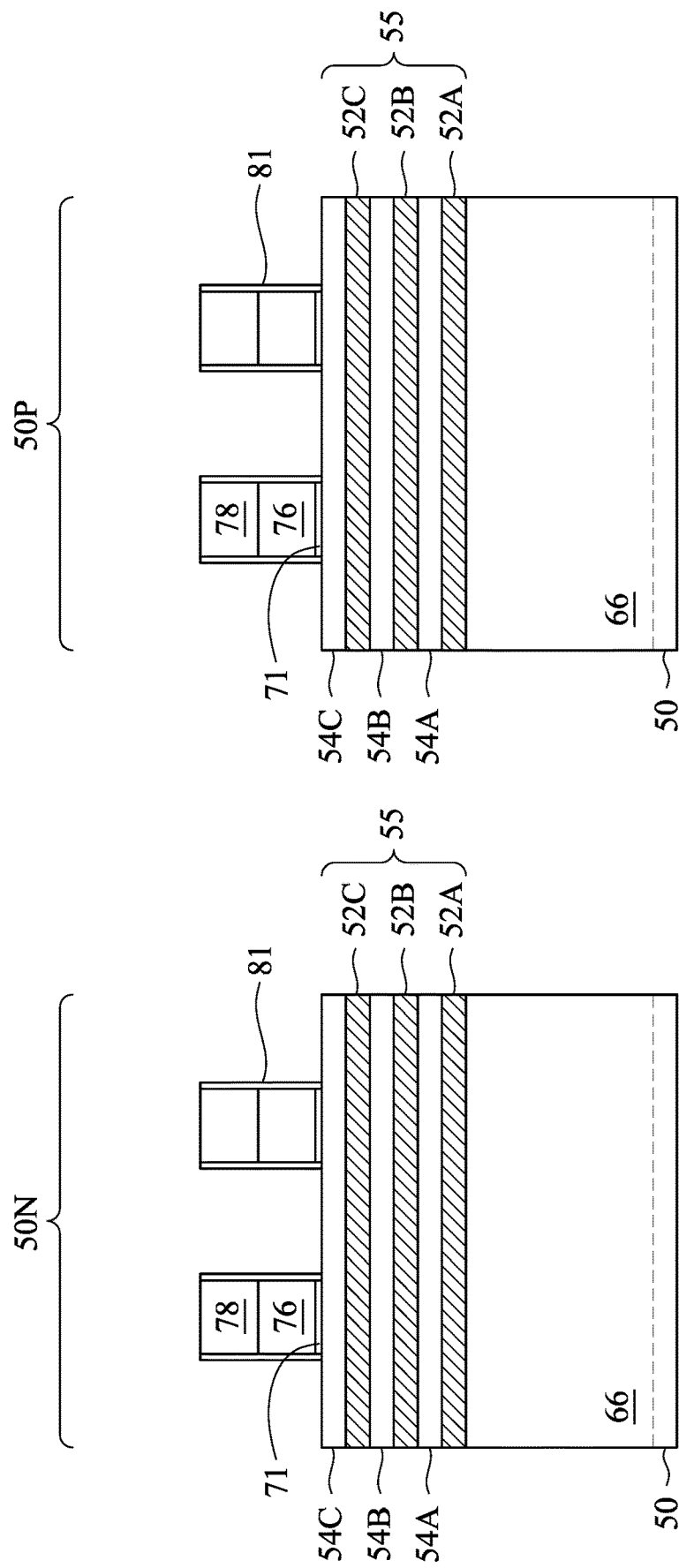

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
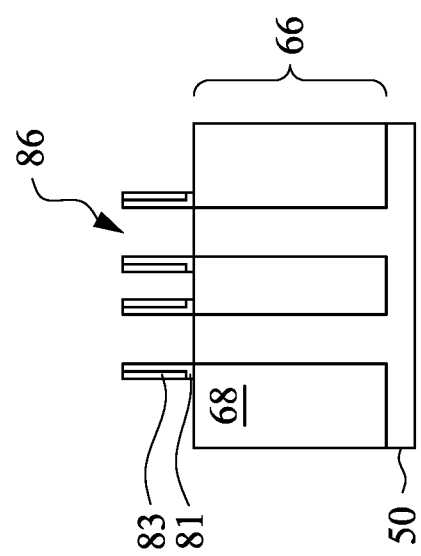
Figure 9B:
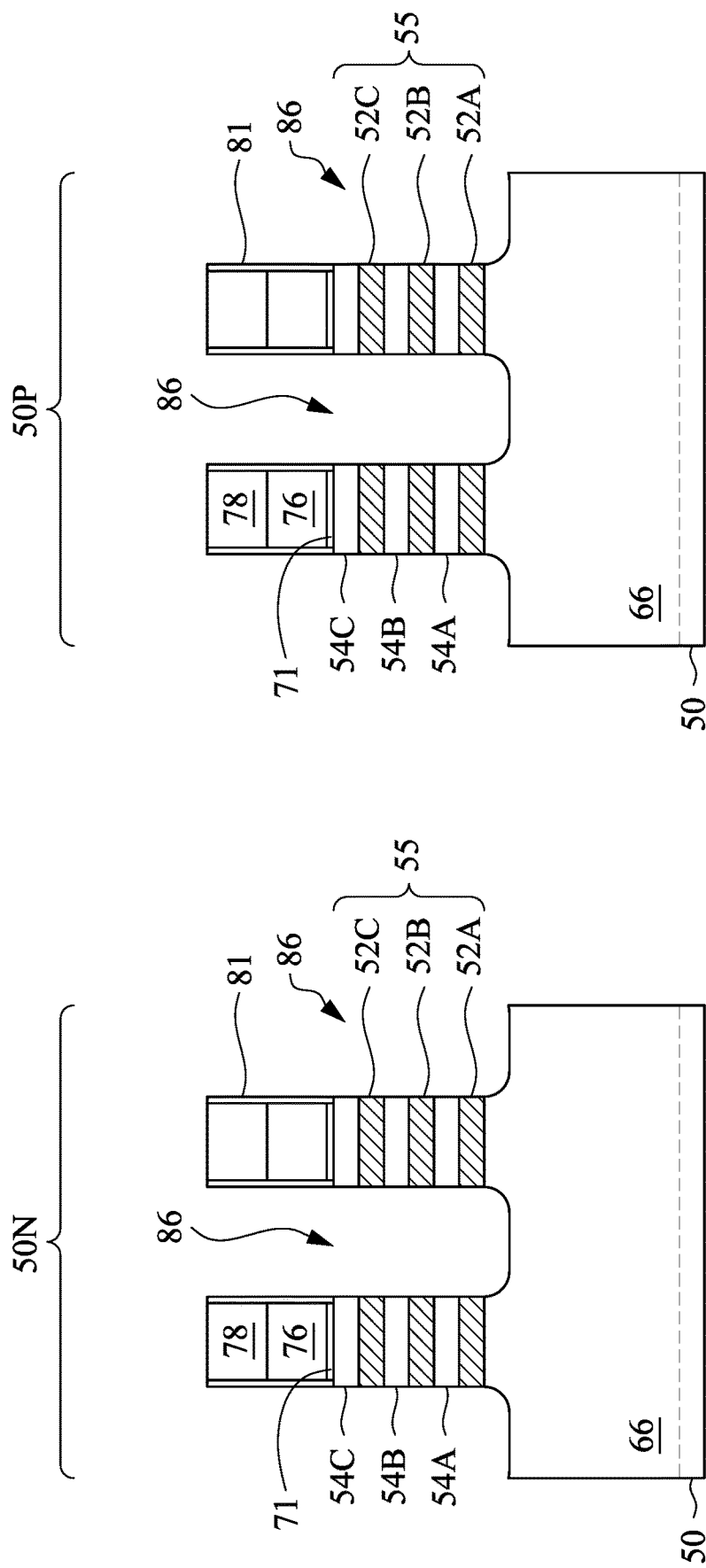

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
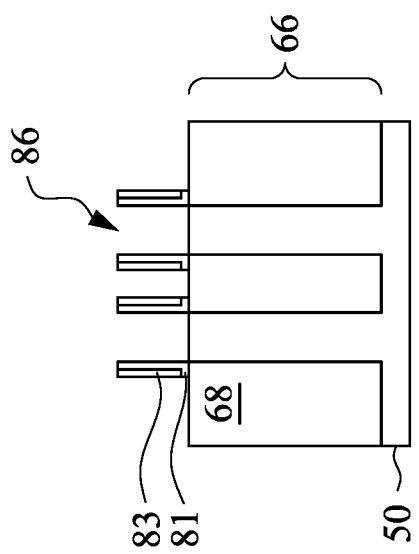
Figure 10B:
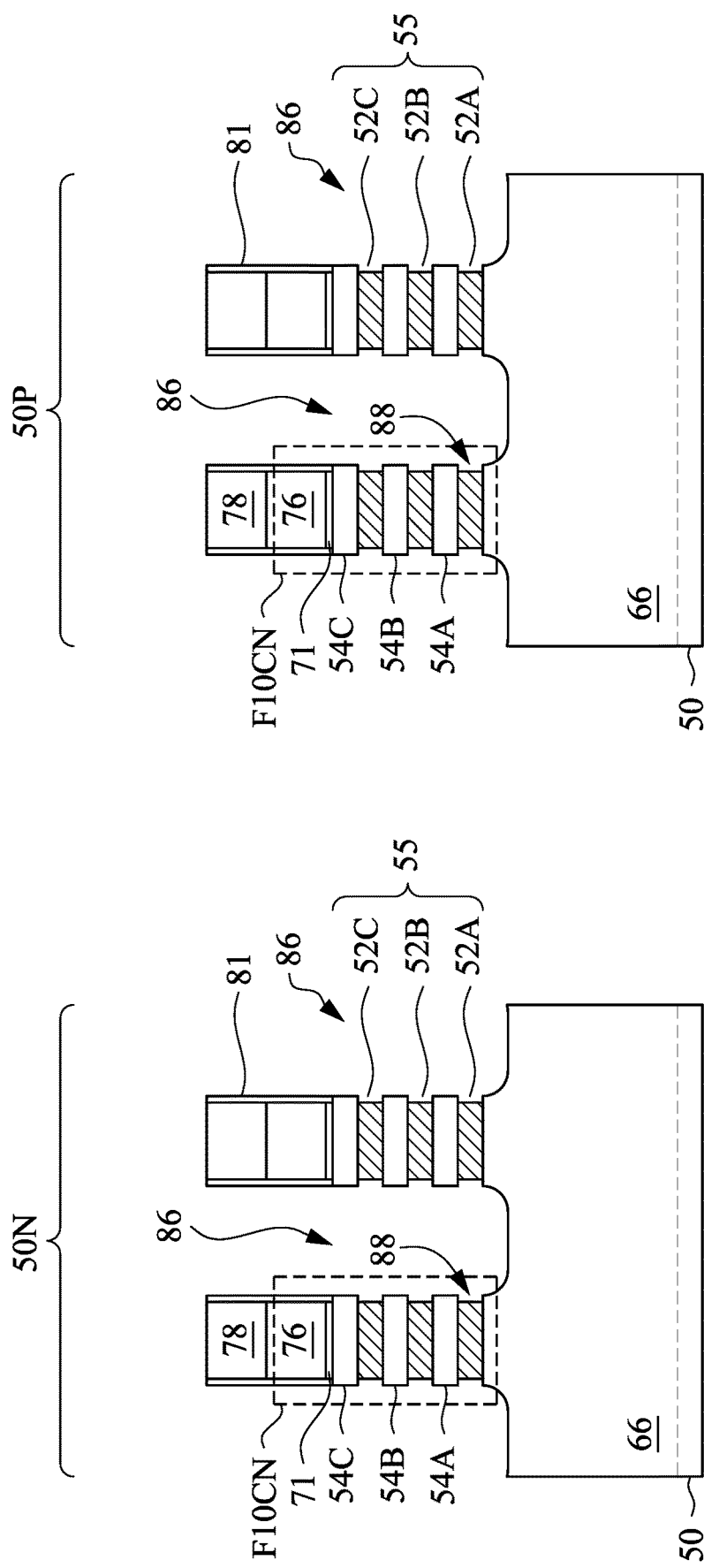
Figure 10C:
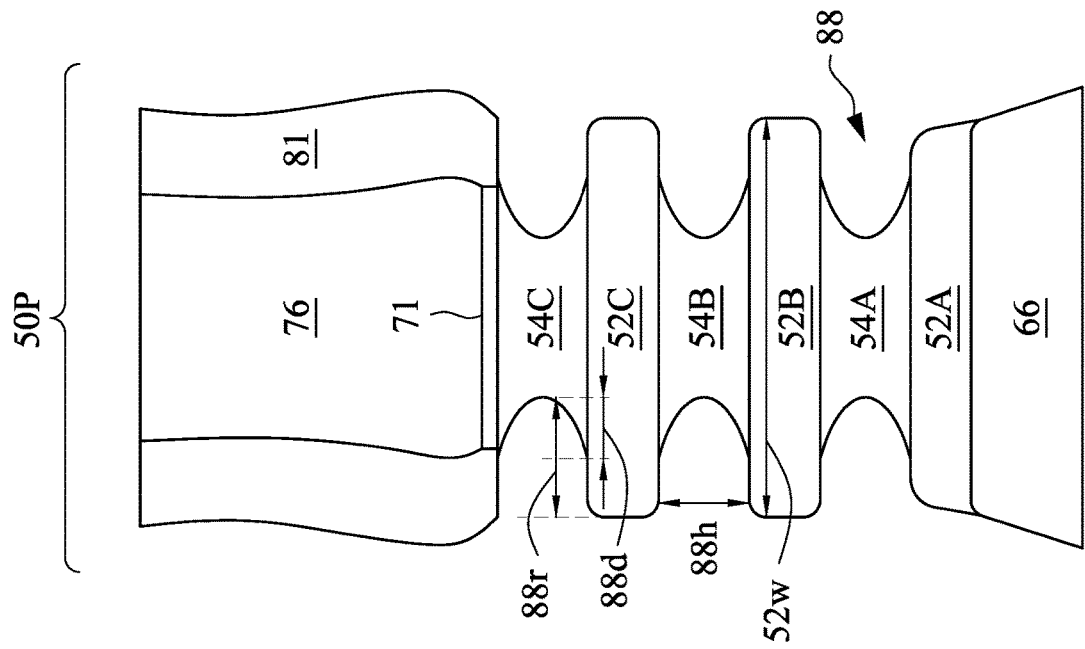
Figure 10C:
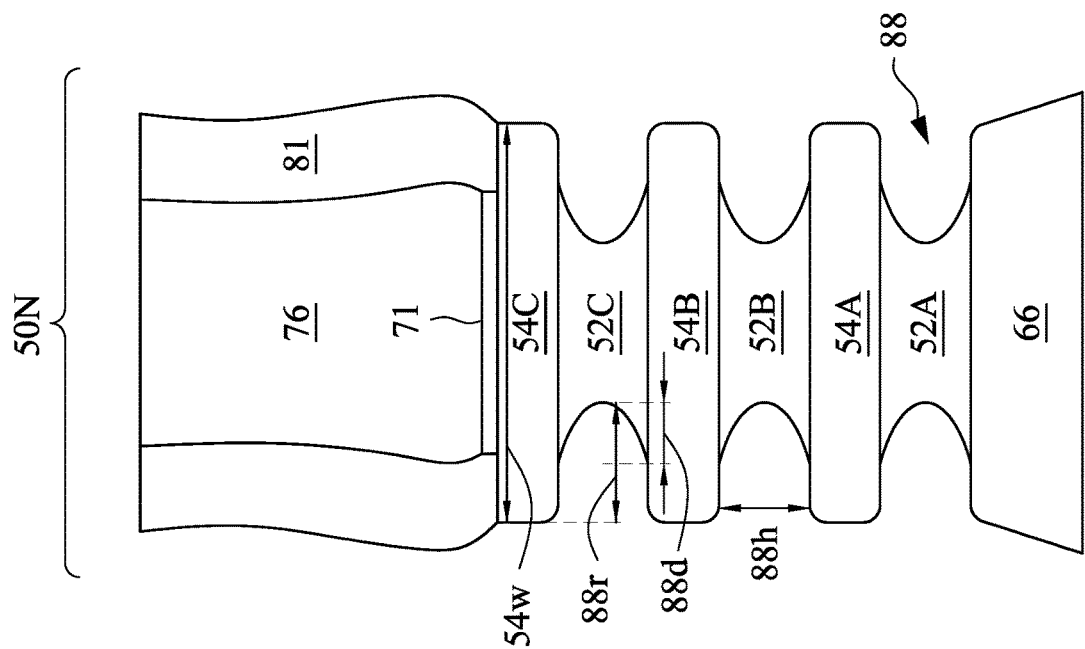

In FIGS. 10A, 10B, and 10C, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be convex or concave, such as illustrated in FIG. 10C. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

FIG. 10C illustrates an enlarged view of the region marked F10CN and F10CP in FIG. 10B, in accordance with some embodiments. Both the first nanostructures 52 and the second nanostructures 54 are etched in the process of forming the sidewall recesses 88, although in the n-type region 50N the first nanostructures 52 are etched more aggressively than the second nanostructures 54 in order to form the sidewall recesses 88. The p-type region 50P has a similar result, except that the second nanostructures 54 are etched more aggressively than the first nanostructures 52, forming the sidewall recesses 88 in the p-type region 50P. The width 54w of the second nanostructures 54 and the width 52w of the first nanostructures may be between about 5 nm and 30 nm. In the n-type region 50N, the lateral recess 88r is measured from the lateral extent of the width 54w of the second nanostructures 54. In the p-type region 50P, the lateral recess 88r is measured from the lateral extent of the width 52w of the first nanostructures 52. In some embodiments, the lateral recess 88r may be between 1 nm and about 15 nm or between 5% and 35% of the width 54w. The etching also may cause a concavity or dishing of the sidewall recesses 88. The extent of dishing can be characterized by the dishing value 88d, which is the distance between the lateral extent of the first nanostructures 52 in the n-type region 50N (or the second nanostructures 54 in the p-type region 50P) and the deepest point of the sidewall recesses 88. In some embodiments, the dishing value 88d of the sidewall recesses 88 may be between 0.5 nm and about 15 nm, or between about 10% and 50% of the lateral recess 88r. It is noted that the dishing value 88d corresponds to an inverse dishing value of the subsequently formed spacers sharing the same interface. The maximum height 88h of the sidewall recesses 88 may be between 1 nm and 10 nm, such as between 2 nm and 8 nm, or between 0% and 20% larger than the thickness of one of the first nanostructures 52 in the n-type region 50N (or of the second nanostructures 54 in the p-type region 50P). Following the formation of the first recesses 86 and sidewall recesses 88, the aspect ratio of the first recesses 86 may be up to about 30:1, that is may have a depth up to about 30 times greater than its width, though greater aspect ratios may be possible and are also contemplated.

Figure 11A:
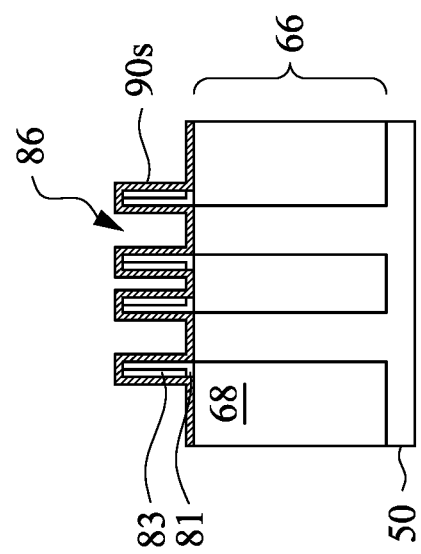
Figure 11B:
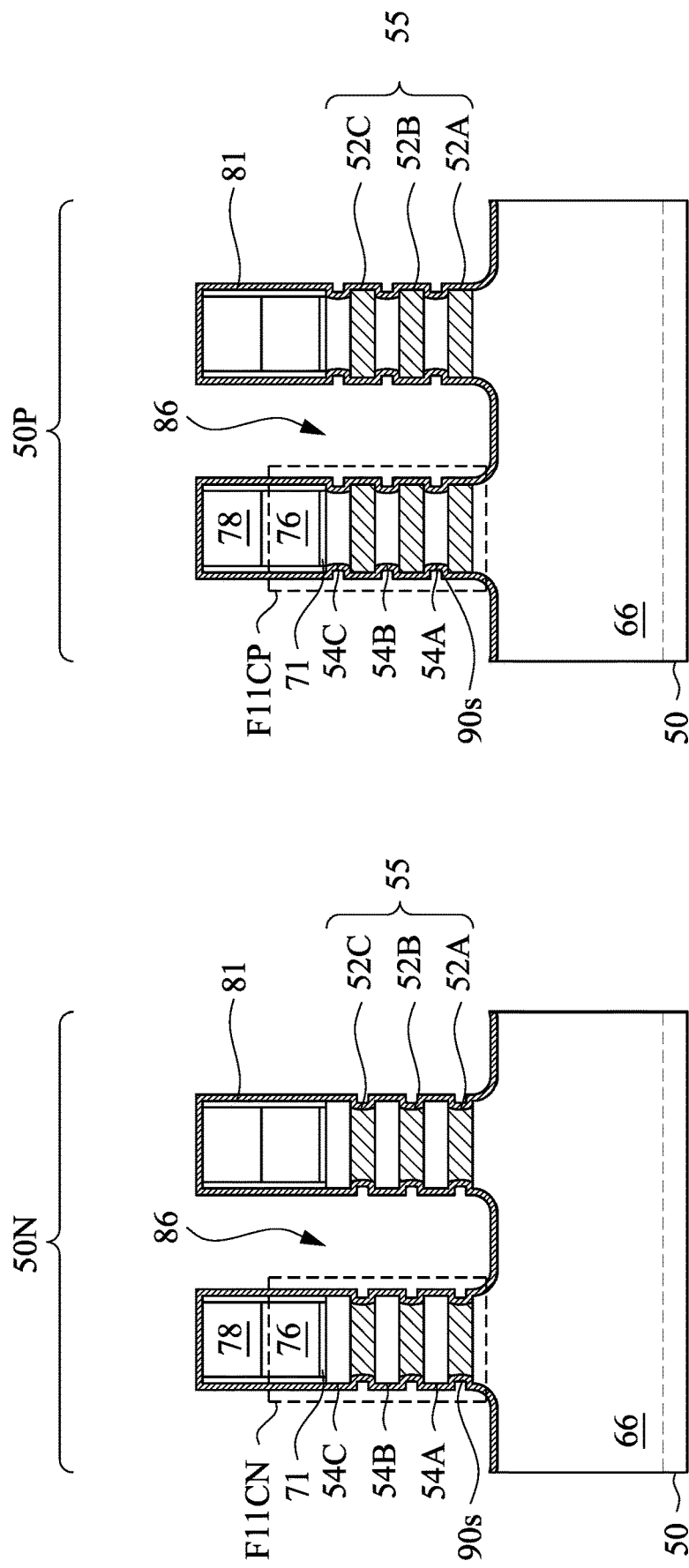
Figure 11C:
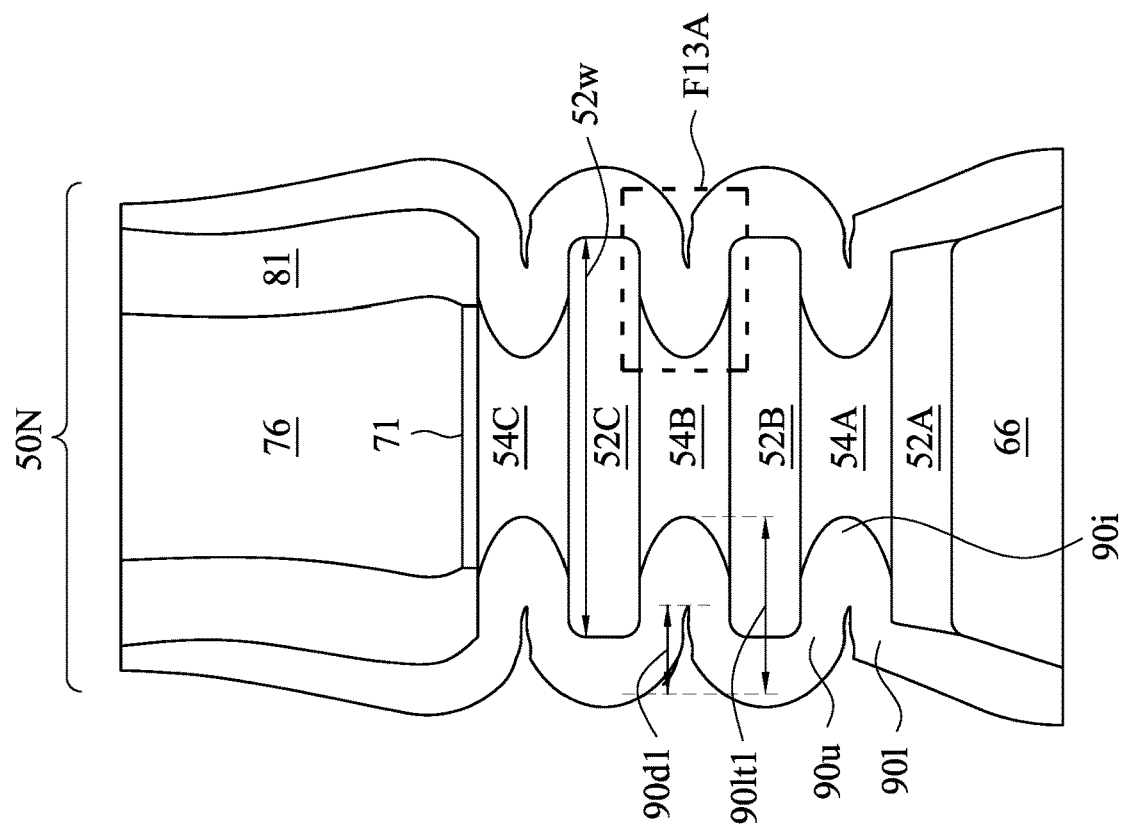
Figure 11C:
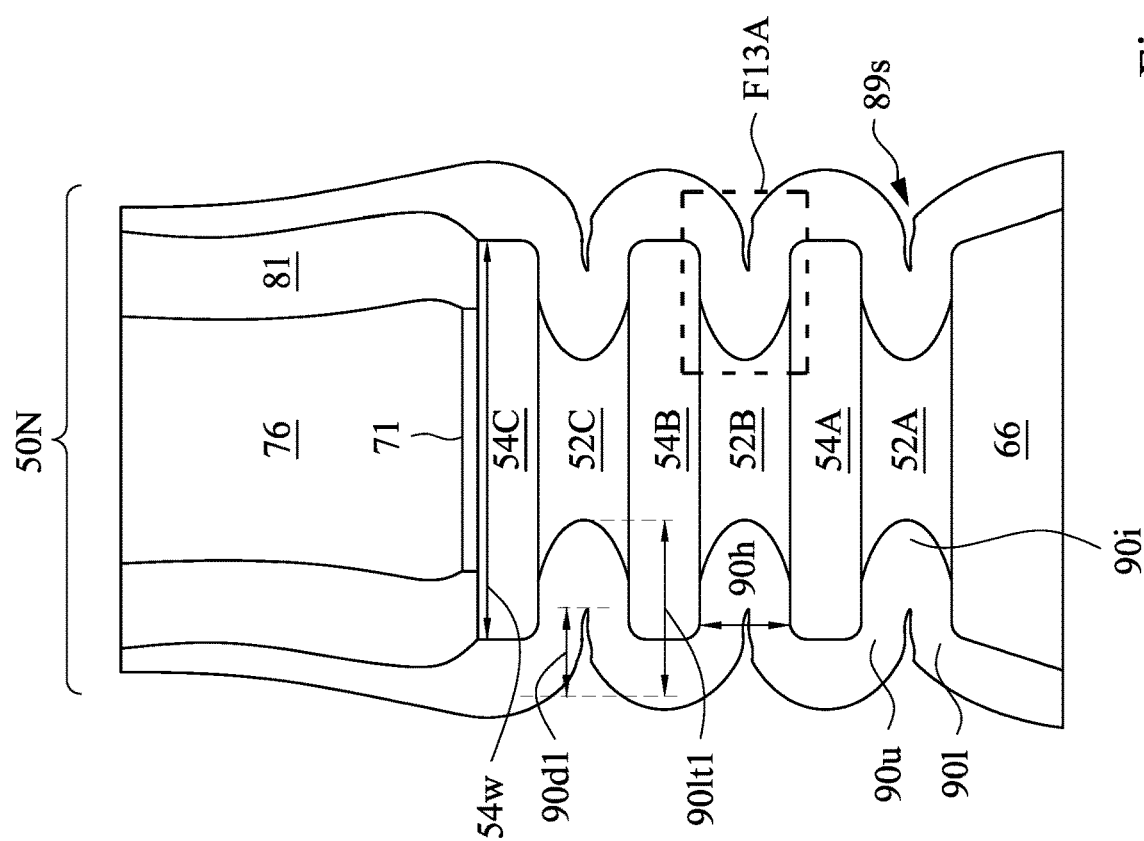

In FIGS. 11A, 11B, and 11C, an inner spacer layer 90s is formed in the sidewall recess 88. The inner spacer layer 90s may be formed by depositing the inner spacer layer 90s over the structures illustrated in FIGS. 10A, 10B, and 10C. In a subsequent step, the inner spacer layer 90s will be etched to form first inner spacers 90. The resulting first inner spacers 90 will act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer 90s may be deposited by a conformal deposition process, such as CVD, ALD, or the like. The conformity of deposition may be between about 50% and 99%. The inner spacer layer 90s may comprise a material such as silicon nitride, silicon oxycarbonitride, or silicon oxynitride, although any suitable material may be utilized. In some embodiments, the inner spacer layer 90s is a low-k spacer layer which may deposited using precursors, such as $SiH_xCl_yR_z$ (R=$CH_3$, $NCH_3$), $SiH_xCl_y$, $SiH_x(R1)_yCl_x$ (R2)$_z$ (R1=CH, R2=$NCH_3$), $C_xH_y$, $N_x/O_y/H_z$ and deposited at temperature between about 200° C. and about 600° C.

As deposited, the inner spacer layer 90s may include an elemental composition where C is 5-15%, N is 10-30%, O is 10-55%, and Si is 30-45%, by molecular weight. The inner spacer layer 90s may be a low-k film with k-value from about 3.0 to 6.0. The density can be varied from about 1 to 3 g/cm$^3$ depending on the composition. For example, in some embodiments, such as when the material is silicon oxycarbonitride, the inner spacer layer 90s may have a k-value between about 4.9 and 5.4 as deposited and may have a density between 2.5 and 2.7 g/cm$^3$.

In FIG. 11C, an enlarged view of the region marked F11CN of FIG. 11B is illustrated and an enlarged view of the region marked F11CP of FIG. 11B is illustrated, in accordance with some embodiments. FIG. 11C illustrates a detailed view of the inner spacer layer 90s following the deposition process.

As illustrated in FIG. 11C, in some embodiments, the deposition process of the first inner spacers 90 results in a lateral or horizontal seam 89 or bird's beak opening formed between an upper portion 90u of the inner spacer layer 90s and a lower portion 90l of the inner spacer layer 90s and having a seam termination corresponding to a side portion 90i of the inner spacer layer 90s. The upper portion 90u of the inner spacer layer 90s results from the conformal deposition of the material of the inner spacer layer 90s on the bottoms of the exposed second nanostructures 54. The lower portion 90l of the inner spacer layer 90s results from the conformal deposition of the material of the inner spacer layer 90s on the tops of the exposed second nanostructures 54. And the side portion 90i of the inner spacer layer 90s results from the conformal deposition of the material of the inner spacer layer 90s on first nanostructures 52 in the sidewall recesses 88. The height 90h of the inner spacer layer 90s between second nanostructures 54 in the n-type region 50N and between first nanostructures in the p-type region 50P corresponds to the height 88h of FIG. 10C. As illustrated in FIG. 11C, the horizontal seam 89 has a beaked opening. The lateral thickness 901t1 of the inner spacer layer 90s may be between 2 nm and 30 nm and the dishing 90d1 prior to processing may be between 25% and 75% of the lateral thickness 901t1, such as between about 1 nm and 23 nm. The extreme dishing and lateral seams 89 would decrease the effectiveness of the first inner spacers 90 leading to worse $C_{eff}$ performance of the transistor when formed. This performance decrease would result because, when the source/drain regions are formed, the source/drain regions can penetrate into the lateral seams 89, reducing the effectiveness of the first inner spacers 90. In some cases, a short may also occur between the subsequently formed source/drain regions and subsequently formed metal gate due to the lateral seams 89.

In some embodiments, a treatment process may be performed on the structures illustrated in FIGS. 11A, 11B, and 11C to reduce the dishing and reduce the lateral seams 89. In other embodiments, the inner spacer layer 90s may first be etched to form first inner spacers 90, followed by the treatment process to reduce the dishing and reduce the lateral seams 89. In embodiments where the inner spacer layer 90s is not etched before performing the treatment process, the etching process illustrated in FIGS. 12A, 12B, and 12C may be performed after the treatment process.

Figure 12A:
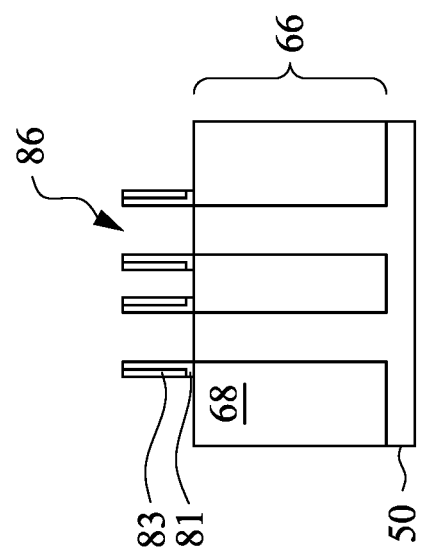
Figure 12B:
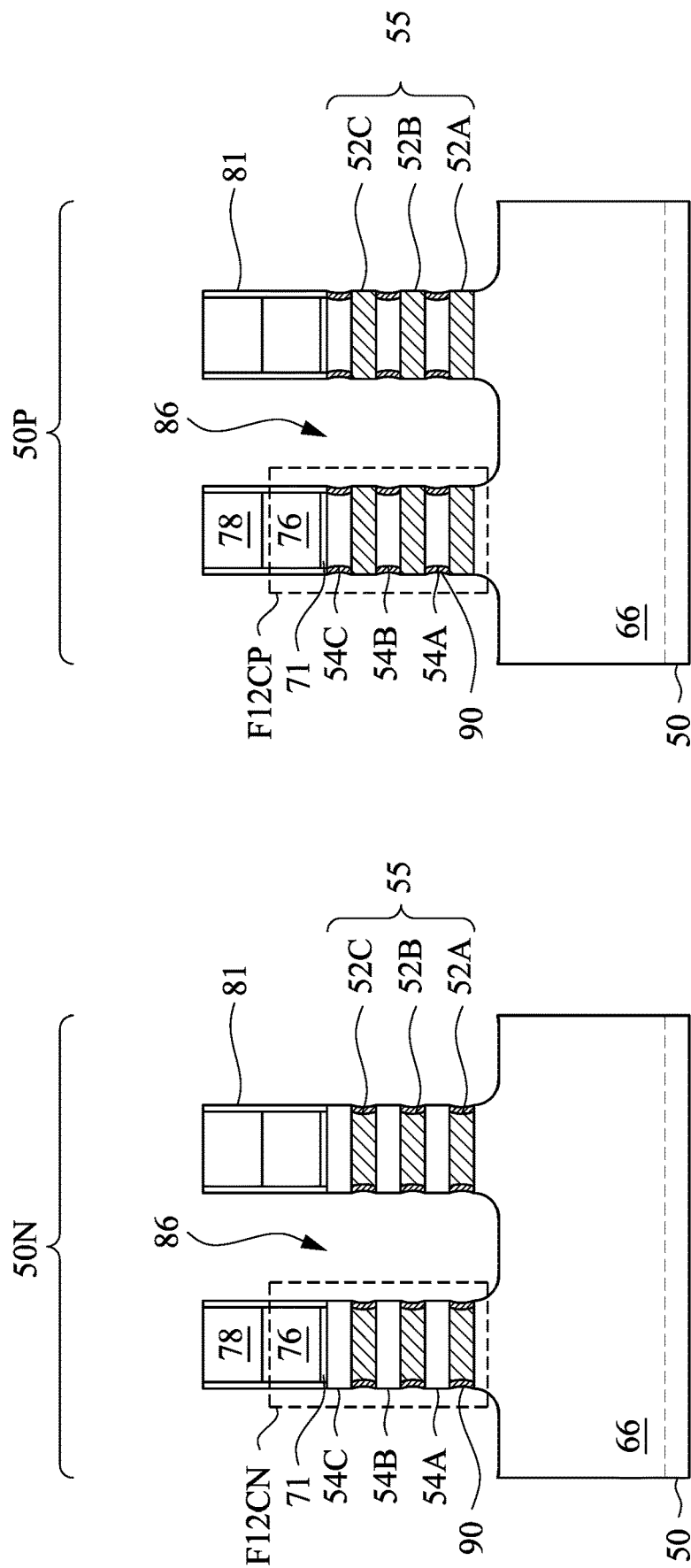
Figure 12C:
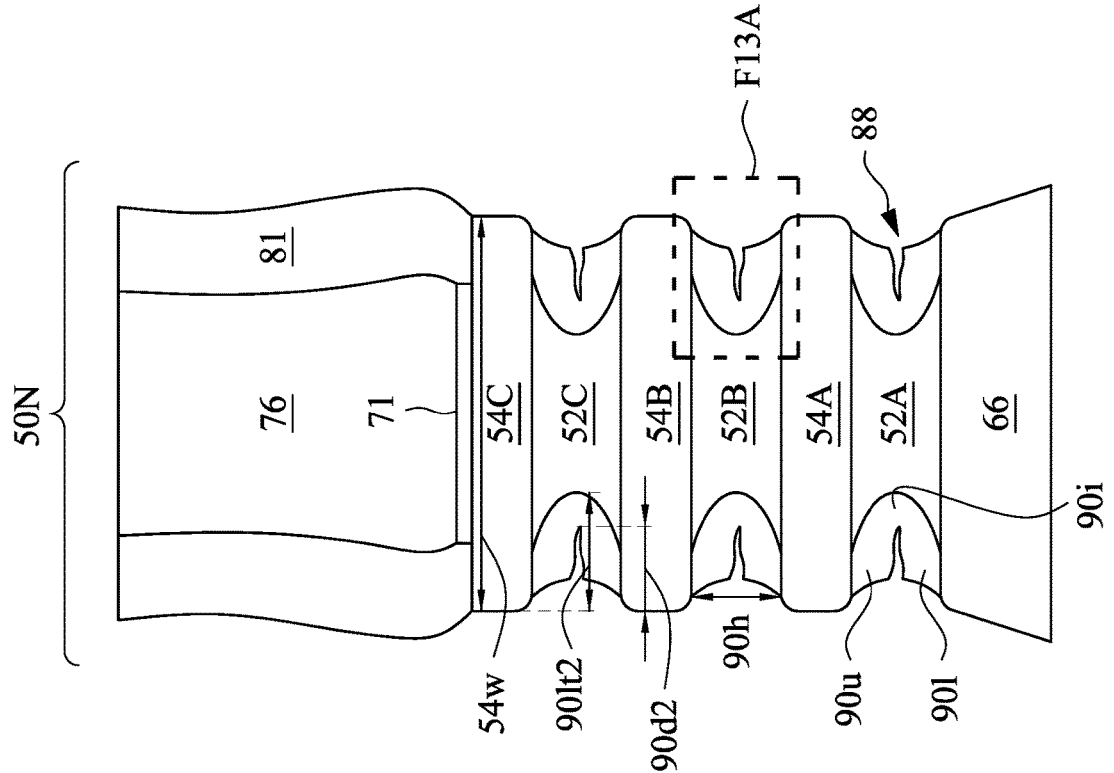
Figure 12C:
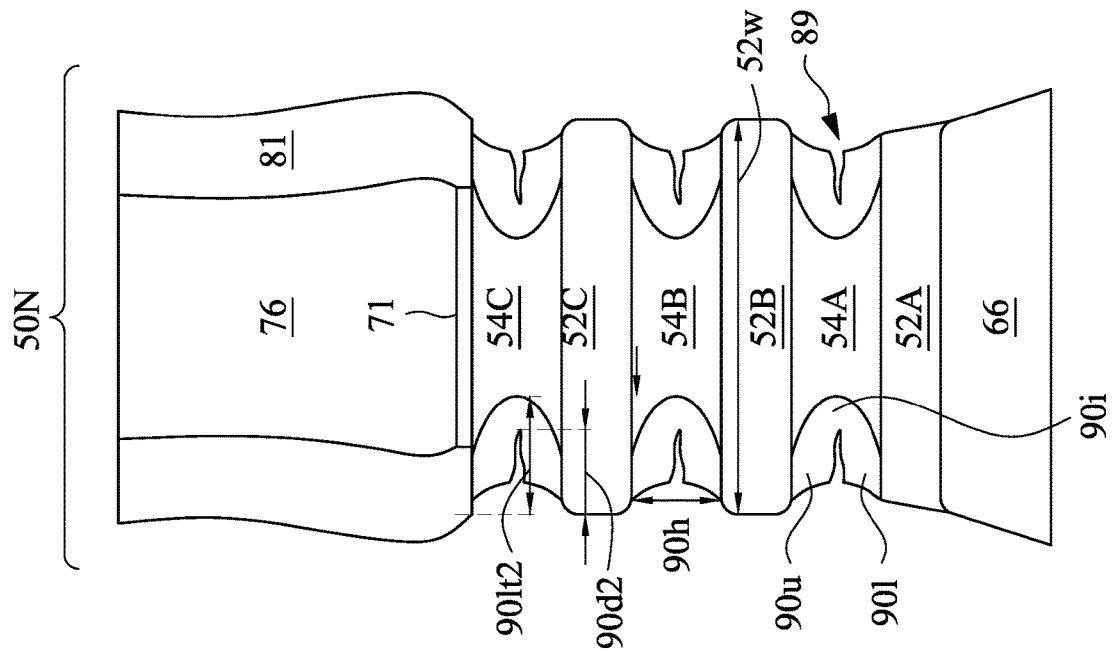

FIGS. 12A, 12B, and 12C illustrate an anisotropic etching process to remove portions of the inner spacer layer 90s to form first inner spacers 90. In some embodiments, such as illustrated in FIG. 12B, the outer sidewalls of the first inner spacers 90 may be recessed from sidewalls of the second nanostructures 54 and/or the first nanostructures 52, respectively (depending on whether in the p-type region 50P or the n-type region 50N). The resulting first inner spacers 90 may form a beak mouthed opening where the deposition conformally follows the contour of the sidewall recesses 88.

The inner spacer layer 90s may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 18A-18C) by subsequent etching processes, such as etching processes used to form gate structures.

In FIG. 12C, an enlarged view of the region marked F12CN of FIG. 12B is illustrated and an enlarged view of the region marked F12CP of FIG. 12B is illustrated, in accordance with some embodiments. FIG. 12C illustrates a detailed view of the first inner spacers 90 following the etching process.

As illustrated in FIG. 12C, in some embodiments, after etching the inner spacer layer 90s to form the first inner spacers 90, the horizontal seam 89 or bird's beak opening formed between the upper portion 90u of the first inner spacers 90 and the lower portion 90l remains in each of the first inner spacers 90. The overall lateral thickness 901t2 of the first inner spacers 90 is between 1 and 15 nm and the dishing 90d2 prior to processing may be between 25% and 75% of the lateral thickness 901t2, such as between about 1 nm and 12 nm. The height 90h of the first inner spacers 90 between second nanostructures 54 in the n-type region 50N and between first nanostructures in the p-type region 50P corresponds to the height 88h of FIG. 10C.

Figure 13C:
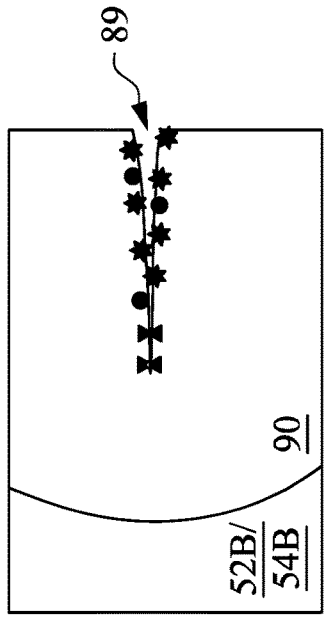
Figure 13D:
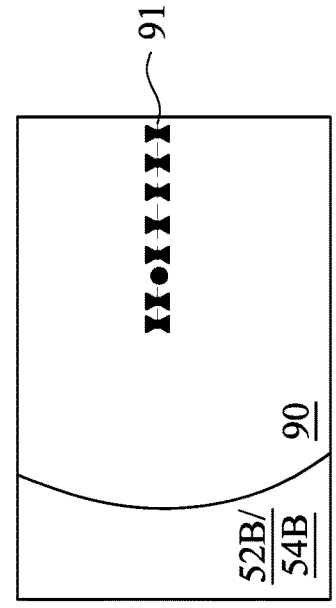
Figure 13A:
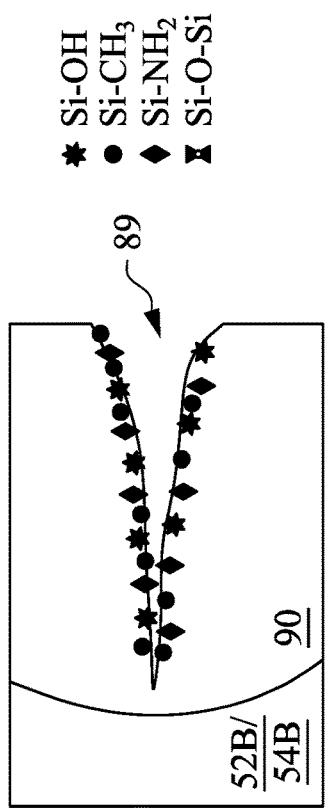
Figure 13B:
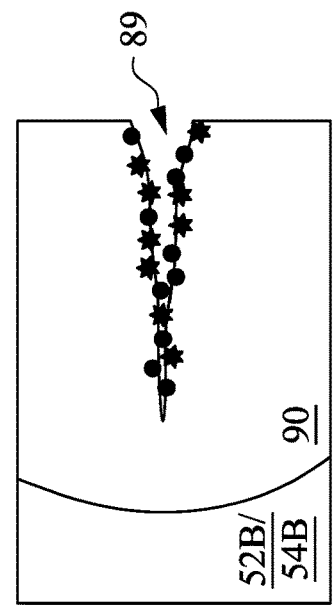

FIGS. 13A-13D illustrate a treatment process to close the lateral seams 89, thereby closing the beaked openings and reducing the dishing associated with the inner spacer layer 90s or first inner spacers 90 (depending on whether the first inner spacers 90 have yet been formed from the inner spacer layer 90s). The process illustrated in FIGS. 13A-13D may be performed on the structure illustrated in FIGS. 11A, 11B, and 11C (i.e., prior to forming the first inner spacers 90) or may be performed on the structure illustrated in FIGS. 12A, 12B, and 12C (i.e., after etching to form the first inner spacers 90). For the sake of simplicity, with reference to FIGS. 13A through 13D, only the first inner spacers 90 will be referenced, however it should be understood that the process described in FIGS. 13A through 13D applies to the inner spacer layer 90s embodiments as well. FIG. 13A illustrates a close up of the box labeled F13A of FIG. 11B or the box labeled F13A of FIG. 12B, depending on whether the etching described above with respect to FIGS. 12A, 12B, and 12C is performed. FIG. 13A also includes a key which is used for FIGS. 13A-13D. In FIG. 13A, prior to the seam closing process, after anisotropically etching the first inner spacers 90, various compounds including amine groups, hydroxyl groups, and methyl groups may be observed at the surfaces of the first inner spacers 90. These compounds may be artifacts of the deposition process for forming the first inner spacers 90 or the subsequent etching process for removing excess material from forming the first inner spacers 90 in the first recesses 86. These compounds may include Si—OH, Si—CH$_3$, and Si—NH$_2$.

Figure 14B:
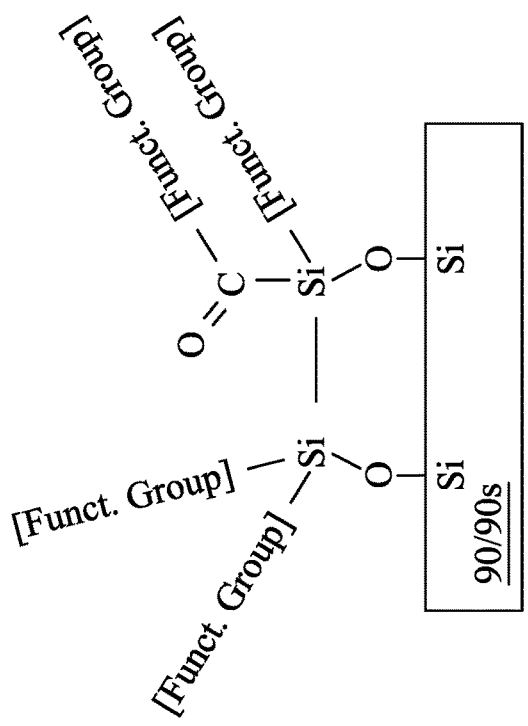
Figure 14A:
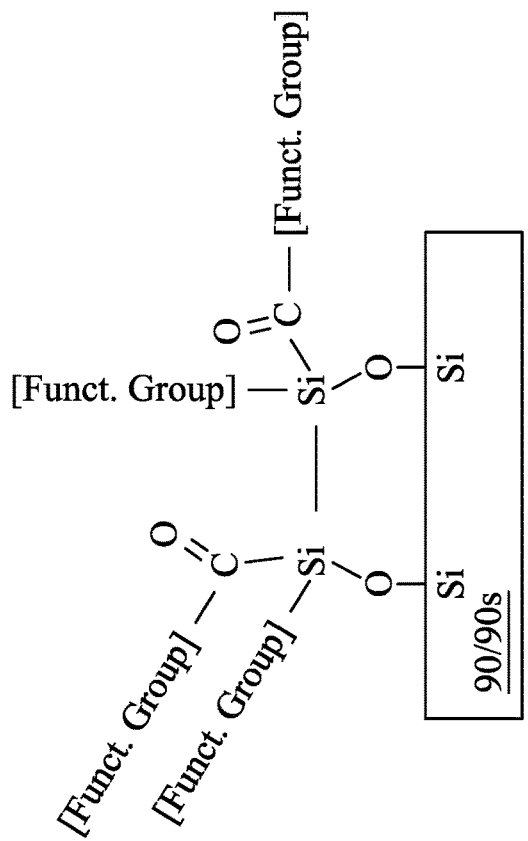

Referring briefly to FIGS. 14A and 14B, the inner spacer layer 90s or first inner spacers 90 are illustrated. In FIG. 14A, one configuration for these compounds is illustrated and in FIG. 14B, another configuration for these compounds is illustrated. Some embodiments may include only the formation in FIG. 14A, some embodiments may include only the formation in FIG. 14B, and some embodiments may include the formation of both compounds. As seen in FIGS. 14A and 14B, silicon at the surface of the inner spacer layer 90s or first inner spacers 90 can be bonded by hydrogen bonds via oxygen atoms to complex compounds including Si, C, O, and Functional Groups, including CH$_3$, NH$_2$ or OH functional groups.

Returning to FIG. 13B, an oxidation anneal is performed. The oxidation anneal provides heavy oxidation of the first inner spacers 90 at a temperature between about 200° C. to about 600° C. for a duration between about 0.1 hour and 12 hours, and at a pressure between about 0.5 atm and 5 atm. The ambient environment can use vapor H$_2$O (steam/wet anneal), CO$_2$, O* related oxidant species, such as O$_2$ and O$_3$, another oxidant, or combinations thereof. The oxidation anneal removes residual amine groups by converting the amine groups into hydroxyl groups (Si—NH$_2$→Si—OH). The oxidation anneal also provides oxygen to the lateral seam 89, causing an expansion of the first inner spacers 90 and a reduction of the lateral seam 89.

In FIG. 13C, the oxidation anneal continues to cause an expansion of the first inner spacers 90 and a reduction of the lateral seam 89, as the percentage of oxygen increases and the percentage of nitrogen decreases, causing the first inner spacers 90 to become less dense and more voluminous. As the lateral seam 89 shrinks, the hydroxyl groups on the upper portion 90u of the first inner spacers 90 and the hydroxyl groups on the lower portion 90l of the first inner spacers 90 may combine to form Si—O—Si bonds (2Si—OH→Si—O—Si+H$_2$O). Following, the oxidation anneal, the processing chamber is degassed.

In FIG. 13D, a dry anneal is performed. The dry anneal may be performed at a higher temperature than the oxidation anneal, such as between about 500° C. and about 800° C., at a pressure from about 0.01 atm to about 2 atm, and for a dwell time between about 0.1 hour and 6 hours. The dry anneal may be performed in an ambient of H$_2$, NH$_3$, N$_2$, Ar, other inert gas(es), the like, and combinations thereof. The dry anneal will cause another expansion of the first inner spacers 90 to pinch the lateral seam 89 closed. At the same time, as the lateral seam 89 closes, the dry anneal causes crosslinking of the hydroxyl groups at the upper portion 90u of the spacer layer 90s or first inner spacers 90 with hydroxyl groups at the lower portion 90l of the first inners spacers 90 to form Si—O—Si bonds and reduce polarization (2Si—OH→Si—O—Si+H$_2$O). The dry anneal will also remove moisture byproduct (H$_2$O) from crosslinking as well as moisture byproduct which may be present from the oxidation anneal (e.g., if steam is used in the oxidation anneal).

The processes of FIGS. 13A-13D may be repeated as many times as desired to achieve seam closing and crosslinking of the upper portion 90u of the spacer 90 and the lower portion 90l of the spacer 90. It should be noted that even though the seam is closed through the process to form the closed seam 91, examination of the first inner spacers 90, can reveal that there once was a seam, such as by observing small gaps in the closed seam 91 or artifacts from the seam closing process, such as remnants of Si—CH$_3$, Si—OH, Si—NH$_2$, and so forth.

Figure 15:
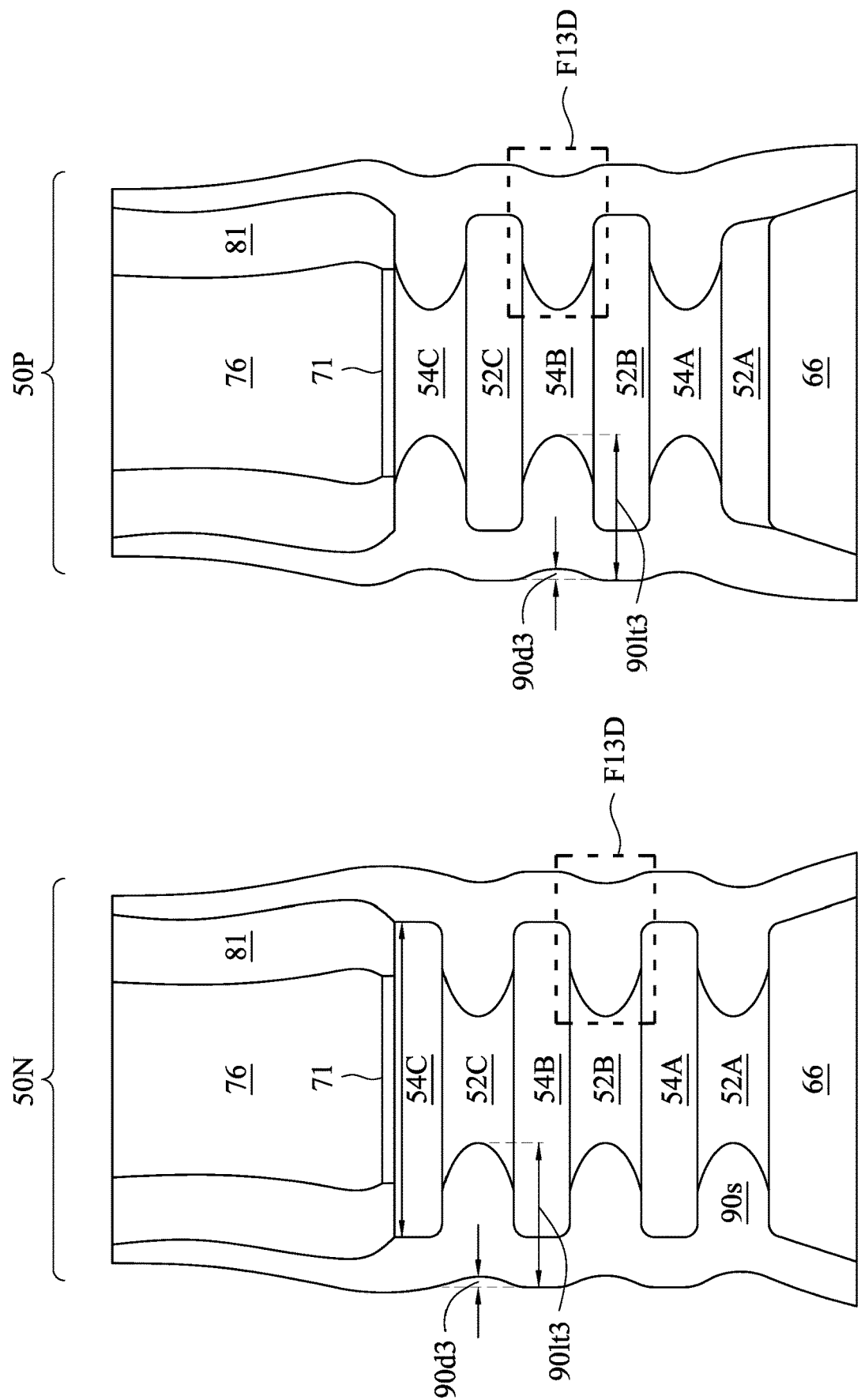

In FIG. 15, enlarged views of the regions marked F11CN and F11CP of FIG. 11B is illustrated, in accordance with some embodiments, after the de-seaming process of FIGS. 13A-13D has been performed. FIG. 13D is consistent with enlarged portion of the region marked F13D in FIG. 15. FIG. 15 illustrates a detailed view of the inner spacer layer 90s in the n-type region 50N and in the p-type region 50P following the de-seaming process.

FIG. 15 illustrates that the dishing 90d3 of the inner spacer layer 90s following the de-seaming process has been reduced from the dishing 90d1 of the inner spacer layer 90s prior to the de-seaming process. In some embodiments, the dishing 90d3 may be between 10% and 50% of the dishing 90d1, such as between 0 nm and 5 nm. In some embodiments, the dishing of the inner spacer layer 90s is completely removed (or will be completely removed when the first inner spacers 90 are formed). The de-seaming process may also reduce the k-value of the material of the inner spacer layer 90s to be less than the k-value of the nominal k-value of the deposited material. For example, the k-value of silicon carbonoxynitride as deposited may be between 4.9 and 5.4, whereas the k-value of the de-seamed inner spacer layer 90s after de-seaming may be between 4.5 and 5.1, representing a reduction between about 5% and 10%. The reduction in k-value occurs due to the oxidation of the inner spacer layer 90s during the heavy oxidation anneal, resulting in particular from the reduction of the percentage content of nitrogen (and increase in oxygen) in the inner spacer layer 90s and density reduction of the inner spacer layer 90s. Further, the size of the inner spacer layer 90s may increase by between about 5% and about 20% and the density of the inner spacer layer 90s may be decreased by about 5% to 15%. For example, the density of silicon carbonoxynitride as deposited may be between 2.5 and 2.7 g/cm$^3$. Following the de-seaming process, the density of the silicon carbonoxynitride may be decreased to be between about 2.2 and 2.4 g/cm$^3$. The resulting lateral thickness, for example, the overall lateral thickness 901t1 of FIGS. 11A, 11B, and 11C of the inner spacer layer 90s may expand to a lateral thickness 901t3 between about 2 nm and 35 nm, such as between 5 nm and 25 nm.

Following the de-seaming process, in some embodiments, the inner spacer layer 90s may have a uniform composition. The inner spacer layer 90s may include an elemental composition where C is 0-10%, N is 0-20%, O is 30-60%, and Si is 25-40%, by molecular weight, after treatment. In some embodiments, the inner spacer layer 90s may exhibit oxidation to a lateral depth between about 0 nm and 8 nm, which depends on the dwell time of the high oxidation anneal. In some embodiments, the oxidation may be uniform for the oxidized portion of the inner spacer layer 90s, while in other embodiments, the oxidation may have a gradient of concentration of oxygen exhibited in the inner spacer layer

90s that may decrease laterally from the outer surface of the inner spacer layer 90s toward the inner surface (at the side 90i) of the inner spacer layer 90s. In such embodiments, the material composition of the inner spacer layer 90s at an interface with the first nanostructures 52 in the n-type region 50N and the second nanostructures 54 in the p-type region 50P may be unchanged from the as-deposited material composition. In other words, the high oxidation anneal is controlled such that the first nanostructures 52 and the second nanostructures 54 are not oxidized. In a subsequent process, the first nanostructures 52 in the n-type region 50N and the second nanostructures 54 in the p-type region 50P are removed and replaced with a replacement metal gate which will then have the interface with the inner spacer layer 90s (e.g., at the side 90i).

Figure 16:
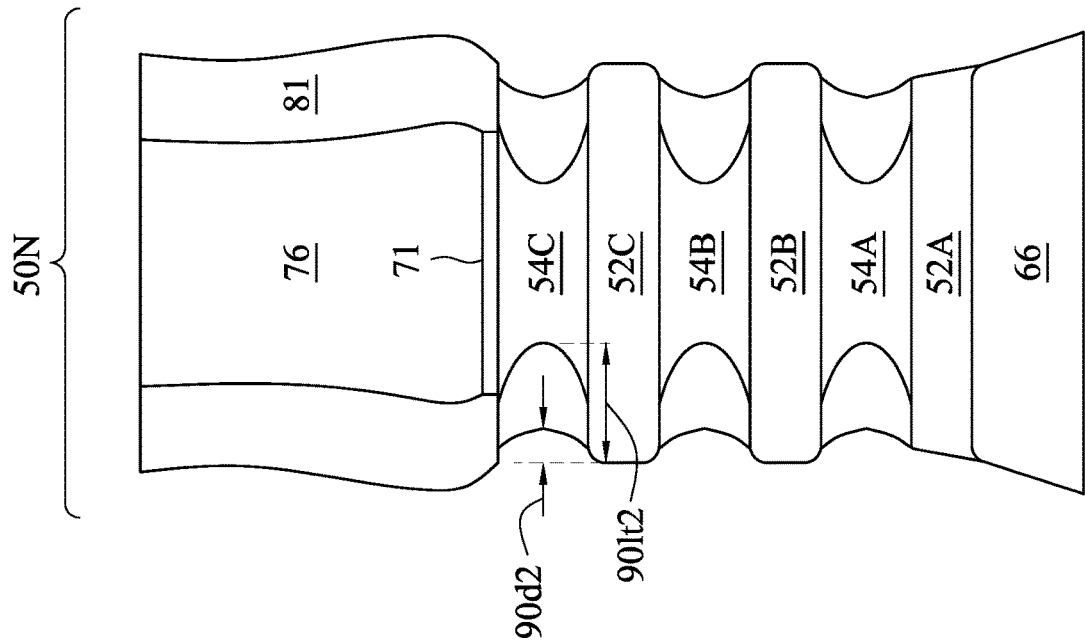
Figure 16:
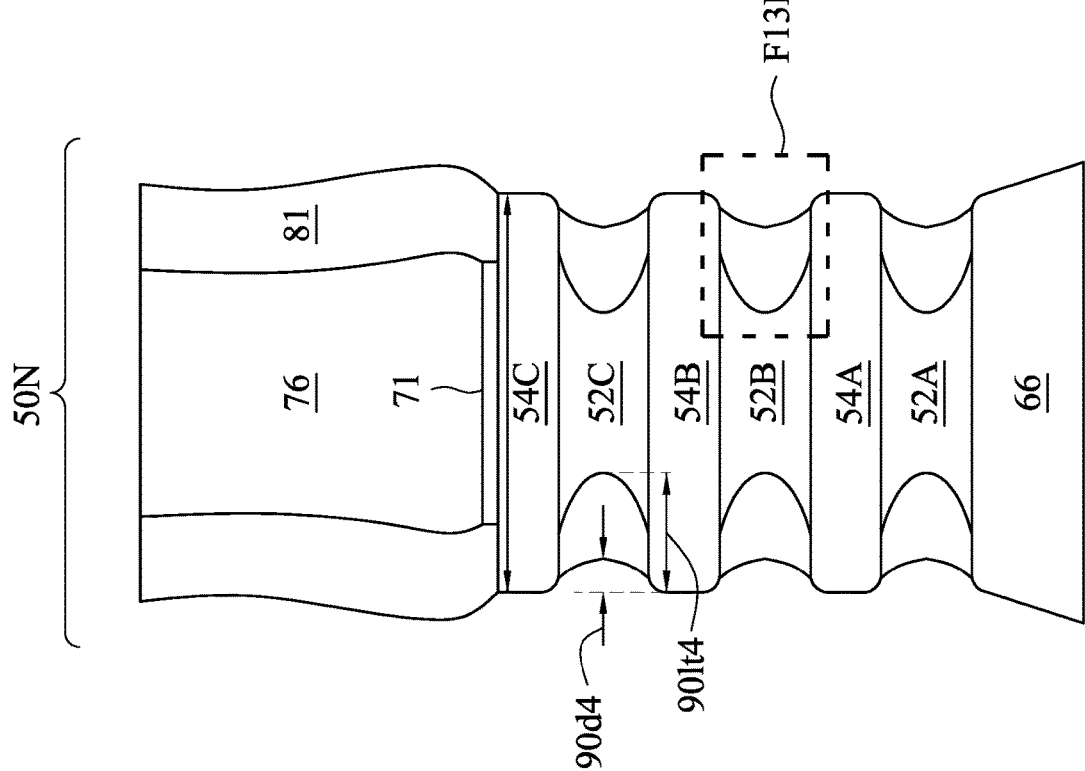

In FIG. 16, enlarged views of the regions marked F12CN and F12CP of FIG. 12B are illustrated, in accordance with some embodiments, after the de-seaming process of FIGS. 13A-13D has been performed. These views are consistent with embodiments that form the first inner spacers 90 prior to performing the de-seaming process. FIG. 13D is consistent with enlarged portion of the region marked F13D in FIG. 16. FIG. 16 illustrates a detailed view of the first inner spacers 90 in the n-type region 50N and in the p-type region 50P following the de-seaming process.

FIG. 16 illustrates that the dishing 90d4 of the first inner spacers 90 following the de-seaming process has been reduced from the dishing 90d2 of the first inner spacers 90 prior to the de-seaming process. In some embodiments, the dishing 90d4 may be between 10% and 50% of the dishing 90d2, such as between 0 nm and 5 nm. In some embodiments, the dishing 90d4 of the first inner spacers 90 is completely removed. The de-seaming process may also reduce the k-value of the material of the first inner spacers 90 to be less than the k-value of the nominal k-value of the deposited material, such as described above with respect to the inner spacer layer 90s. Further, the size of the first inner spacers 90 may increase by between about 5% and about 20% and the density of the inner spacer layer 90s may be decreased by about 5% to 15%. The resulting lateral thickness, for example, the overall lateral thickness 901t2 of FIGS. 12A, 12B, and 12C of the first inner spacers 90 may expand to a lateral thickness 901t4 between about 1 nm and 18 nm, such as between 5 nm and 15 nm.

Following the de-seaming process, in some embodiments, the first inner spacers 90 may have a uniform composition. The first inner spacers 90 may include an elemental composition where C is 0-10%, N is 0-20%, O is 30-60%, and Si is 25-40%, by molecular weight, after treatment. In some embodiments, the first inner spacers 90 may exhibit oxidation to a lateral depth between about 0 nm and 8 nm, which depends on the dwell time of the high oxidation anneal. In some embodiments, the oxidation may be uniform for the oxidized portion of the first inner spacers 90, while in other embodiments, the oxidation may have a gradient of concentration of oxygen exhibited in the first inner spacers 90 that may decrease laterally from the outer surface of the first inner spacers 90 toward the inner surface (at the side 90i) of the first inner spacers 90. In such embodiments, the material composition of the first inner spacers 90 at an interface (at the side 90i) with the first nanostructures 52 in the n-type region 50N and the second nanostructures 54 in the p-type region 50P may be unchanged from the as-deposited material composition. In other words, the high oxidation anneal is controlled such that the first nanostructures 52 in the n-type region 50N and the second nanostructures 54 in the p-type region 50P are not oxidized. In a subsequent process, the first nanostructures 52 in the n-type region 50N and the second nanostructures 54 in the p-type region 50P are removed and replaced with a replacement metal gate which will then have the interface with the first inner spacers 90 (e.g., at the side 90i).

Figure 17A:
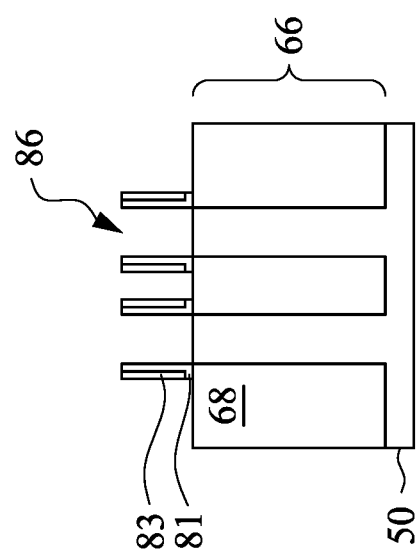
Figure 17B:
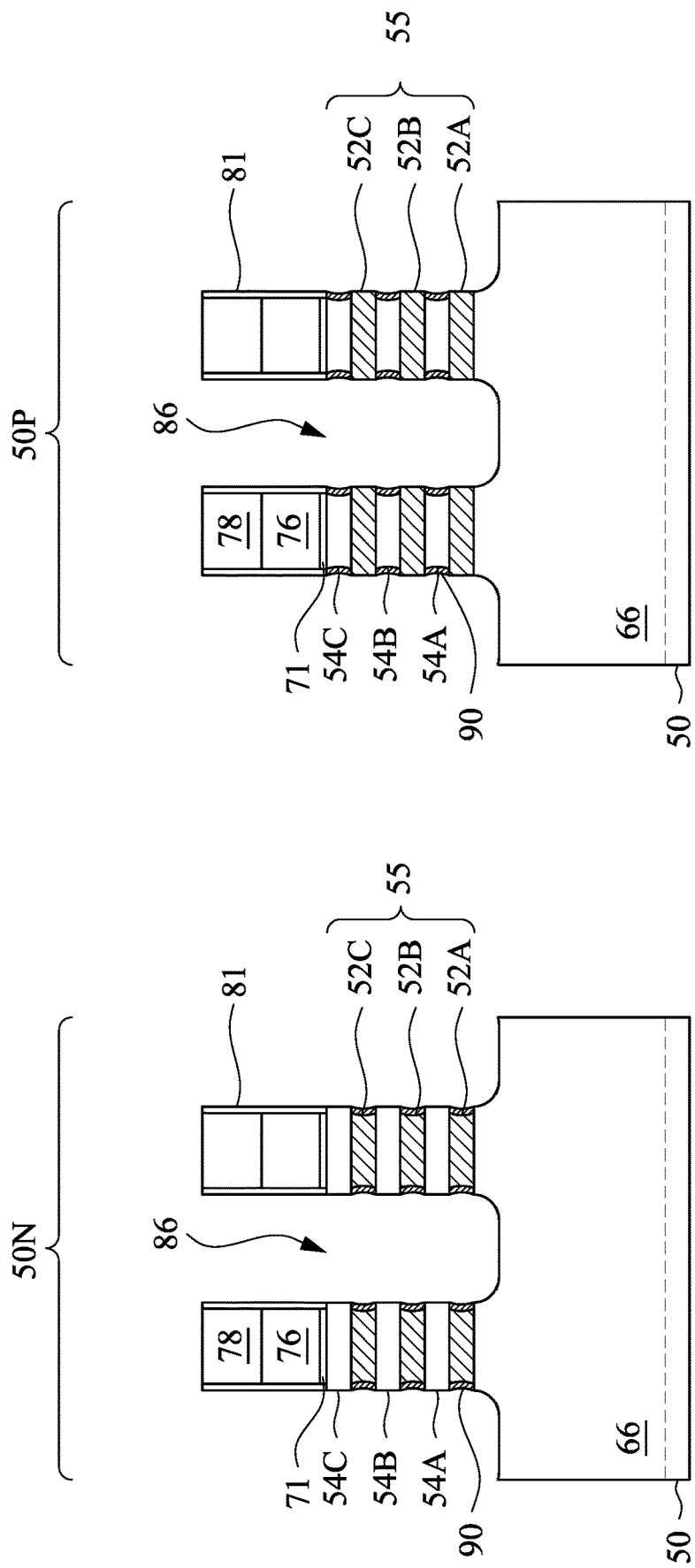

FIGS. 17A and 17B illustrate an anisotropic etching process performed on the structure illustrated in FIG. 14 to remove portions of the inner spacer layer 90s post-treatment process to form first inner spacers 90. In some embodiments, such as illustrated in FIG. 17B, the outer sidewalls of the first inner spacers 90 may be recessed from sidewalls of the second nanostructures 54 and/or the first nanostructures 52, respectively (depending on whether in the p-type region 50P or the n-type region 50N). The resulting first inner spacers 90 may have a reduced or eliminated dishing profile which may be similar to those discussed above with respect to FIG. 15.

The inner spacer layer 90s may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 18A-18C) by subsequent etching processes, such as etching processes used to form gate structures.

In some embodiments, any remaining dishing from in the spacer layer 90s post treatment process may be removed when the spacer layer 90s is etched to form the first inner spacers 90. In such embodiments, the deepest part of the remaining dishing (see dishing 90d3 of FIG. 15) may be exposed to the anisotropic etch used to form the first inner spacers 90, thereby eliminating the dishing in the first inner spacers 90. Eliminating the dishing in the first inner spacers 90 advantageously provides better separation between subsequently formed source/drain regions and subsequently formed replacement gate structures.

Figure 18A:
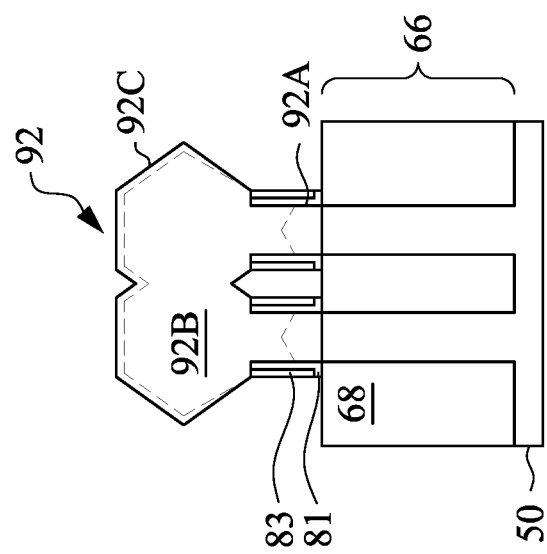
Figure 18B:
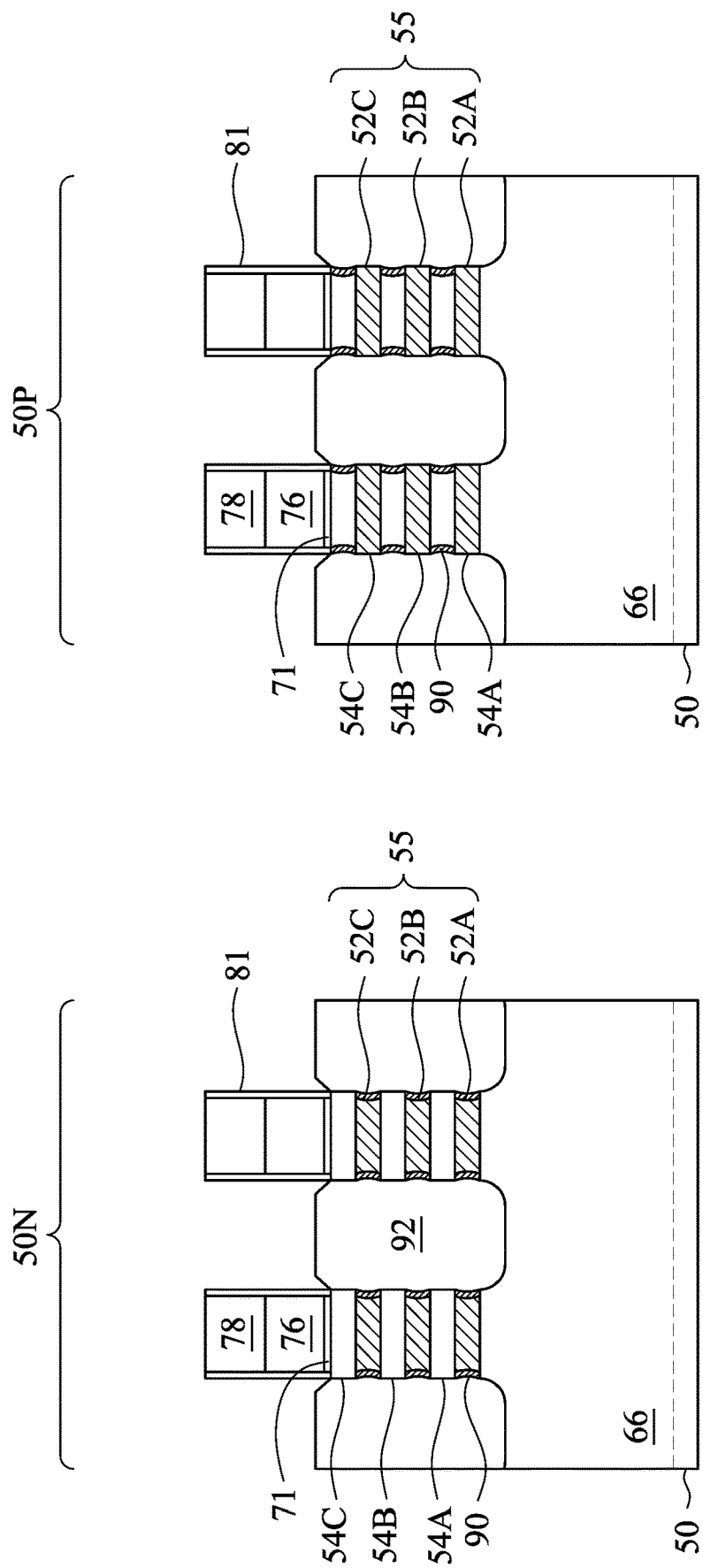
Figure 18C:
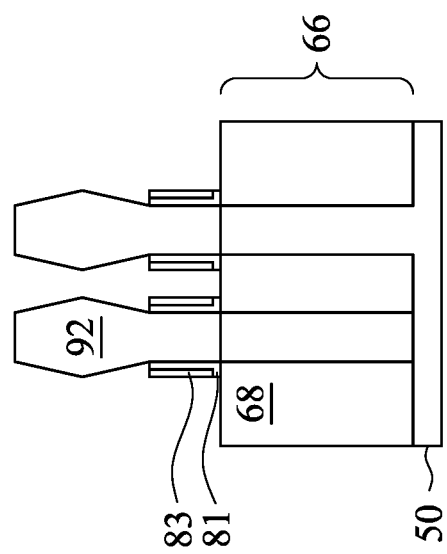

In FIGS. 18A-18C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 18A In other embodiments, adjacent epitaxial source/drain regions 92 remain separated after the epitaxy process is completed as illustrated by FIG. 18C. In the embodiments illustrated in FIGS. 18A and 18C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 19A:
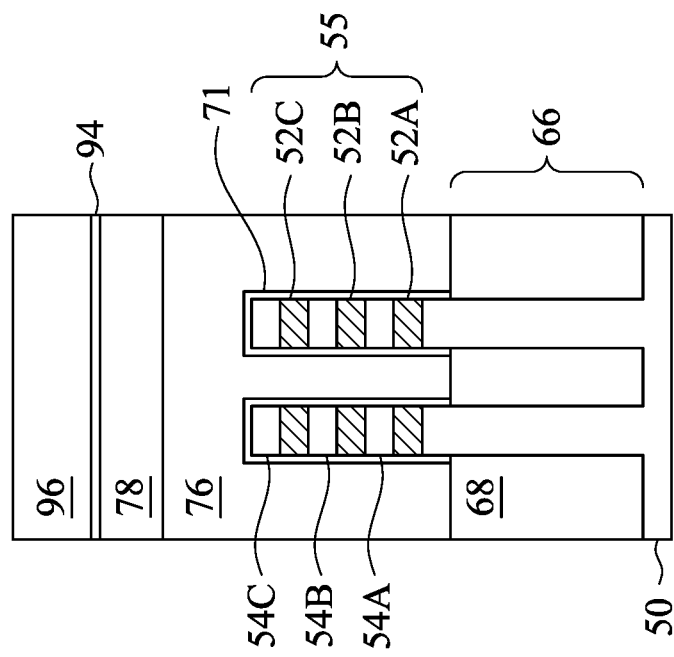
Figure 19B:
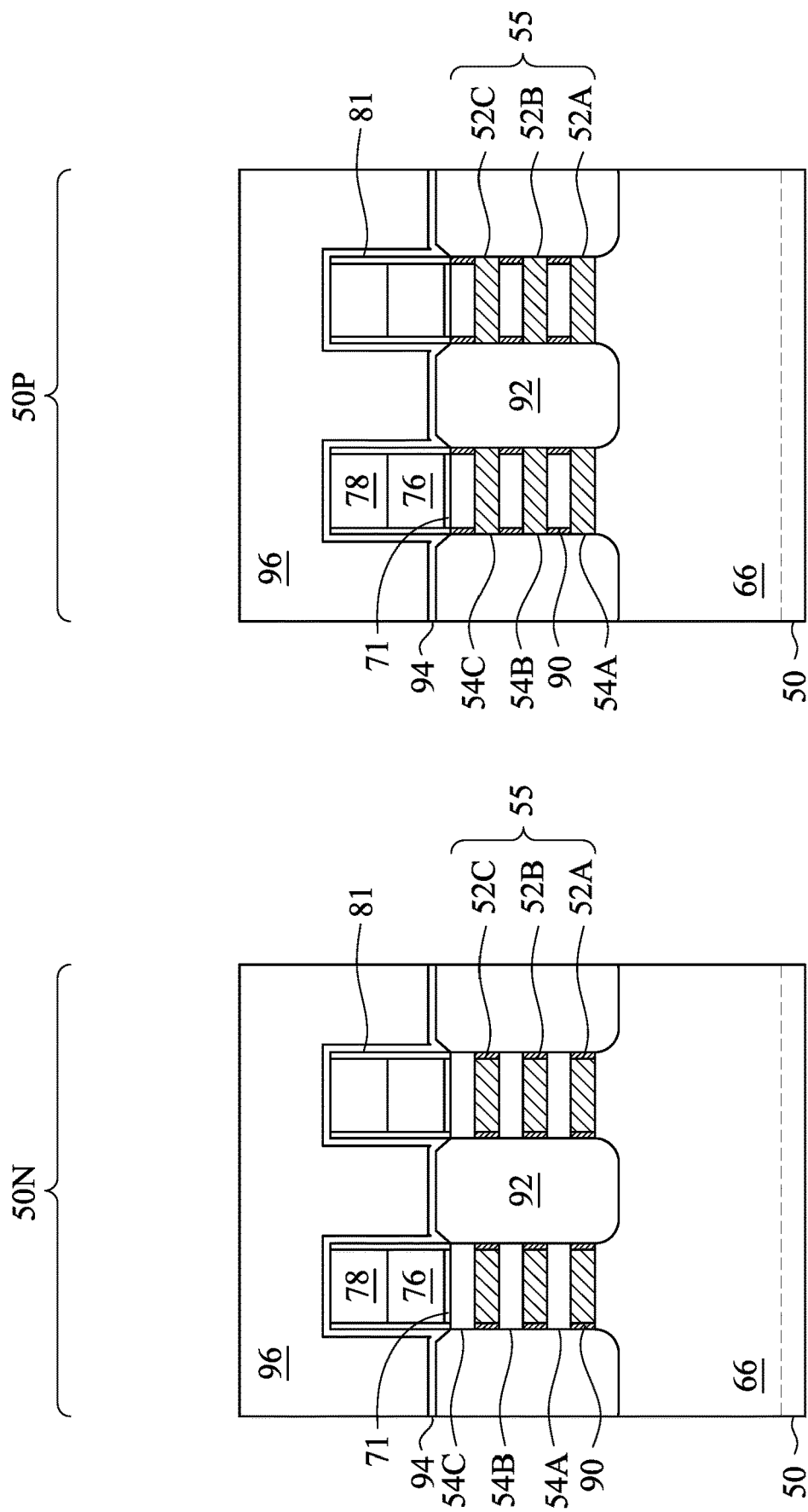
Figure 19C:
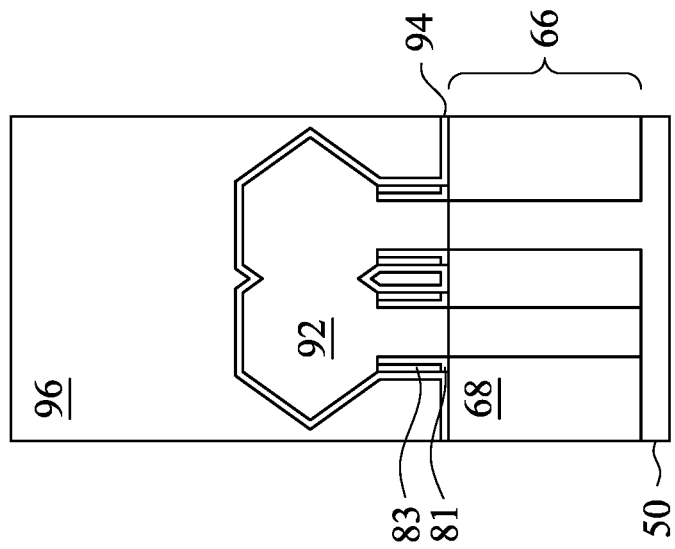

In FIGS. 19A-19C, a first interlayer dielectric (ILD) 96 is deposited over the structure illustrated in FIGS. 6A, 18B, and 18A (the processes of FIGS. 7A-18C do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 20A:
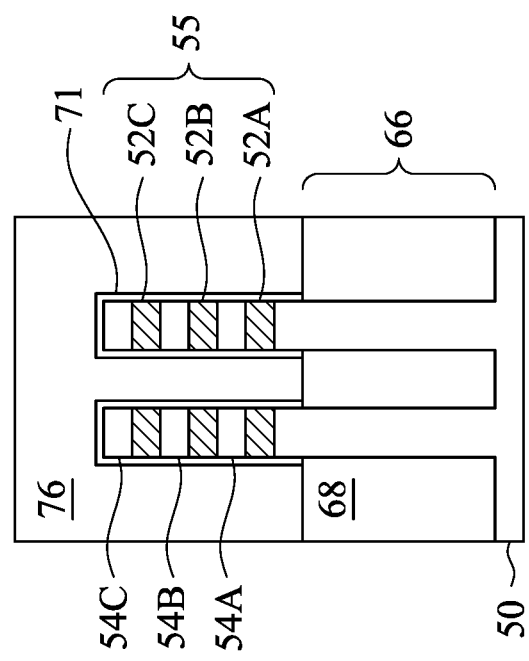
Figure 20B:
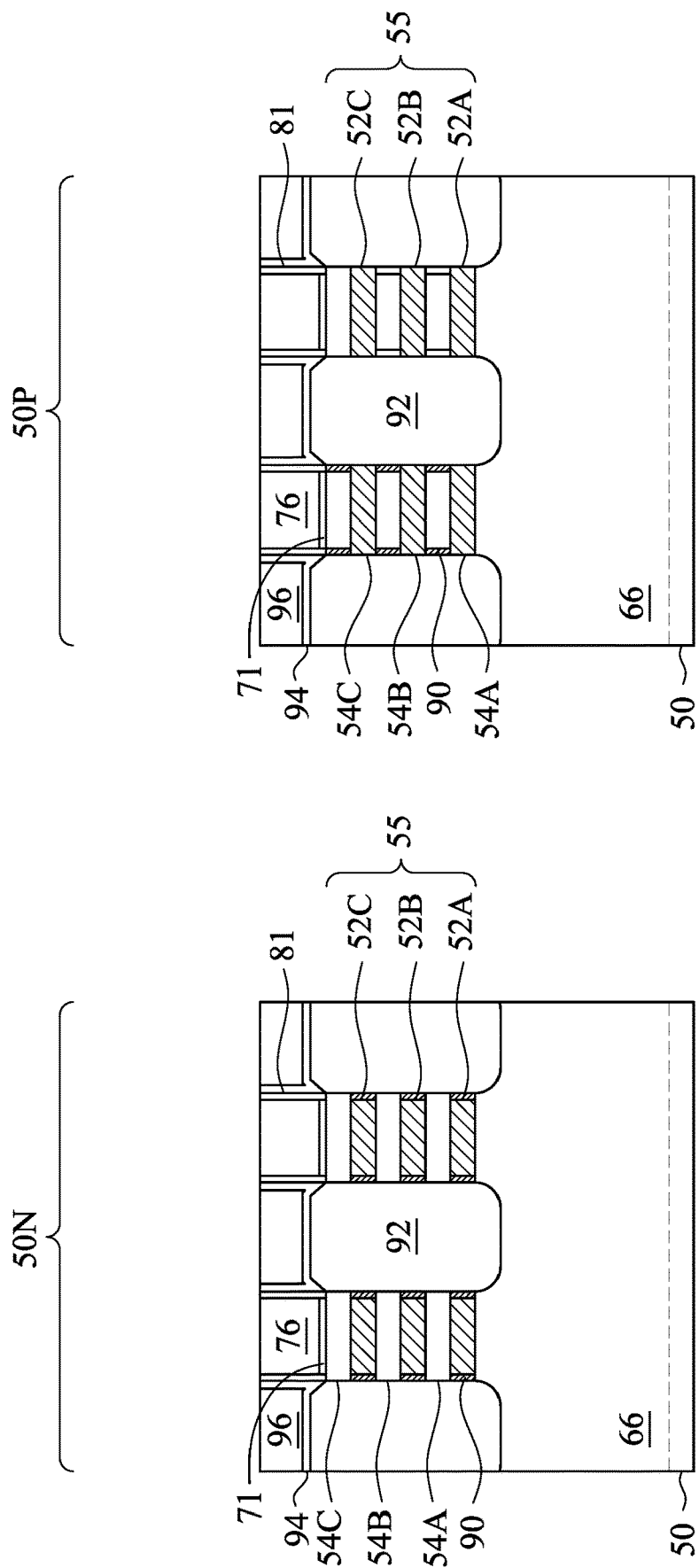

In FIGS. 20A-20B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 21A:
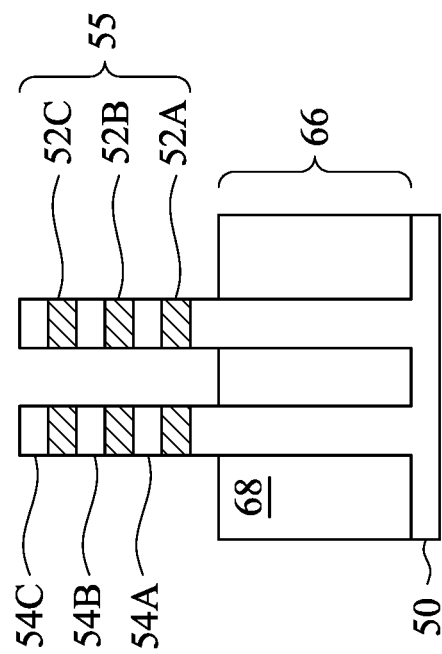
Figure 21B:
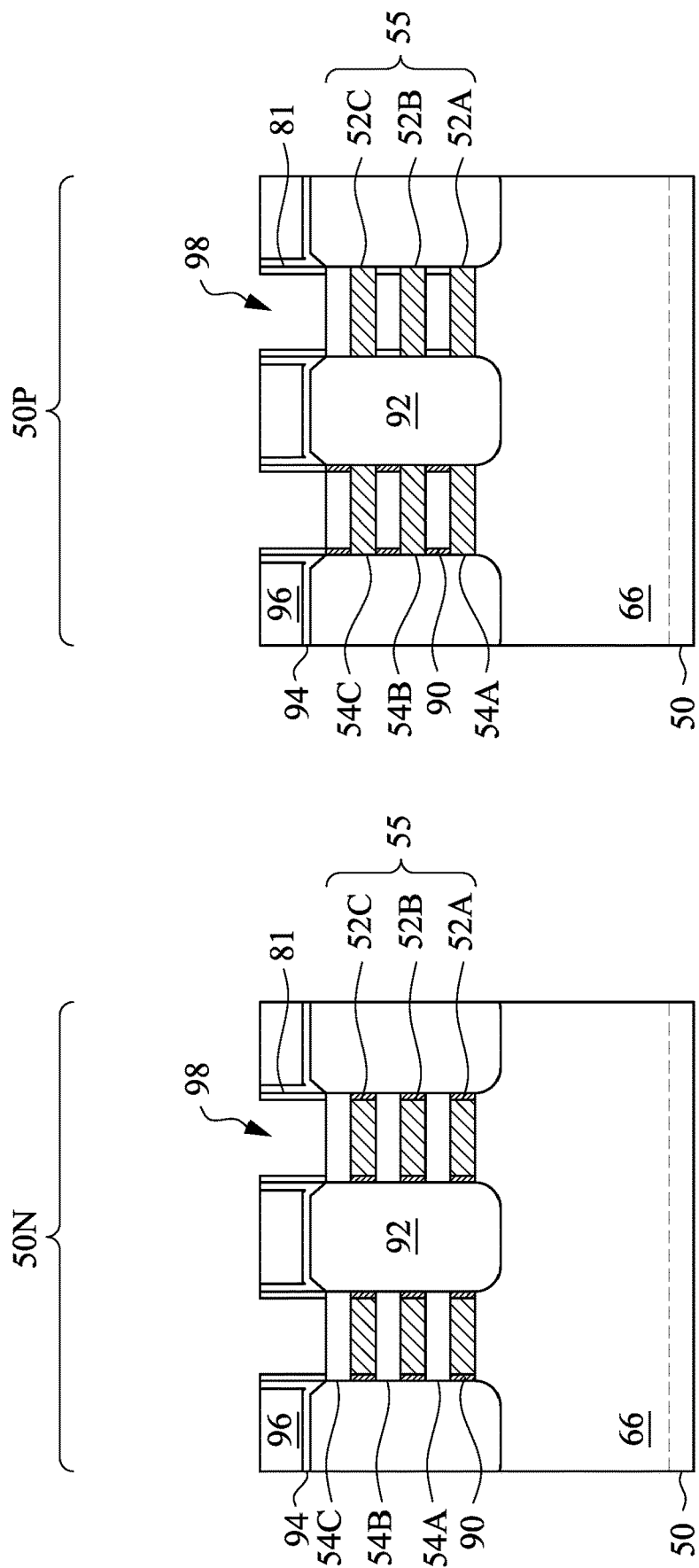

In FIGS. 21A and 21B, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 22A:
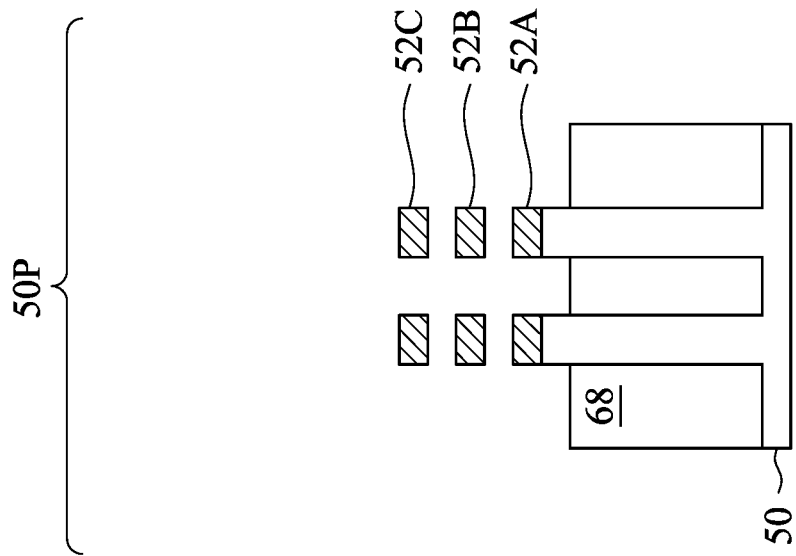
Figure 22A:
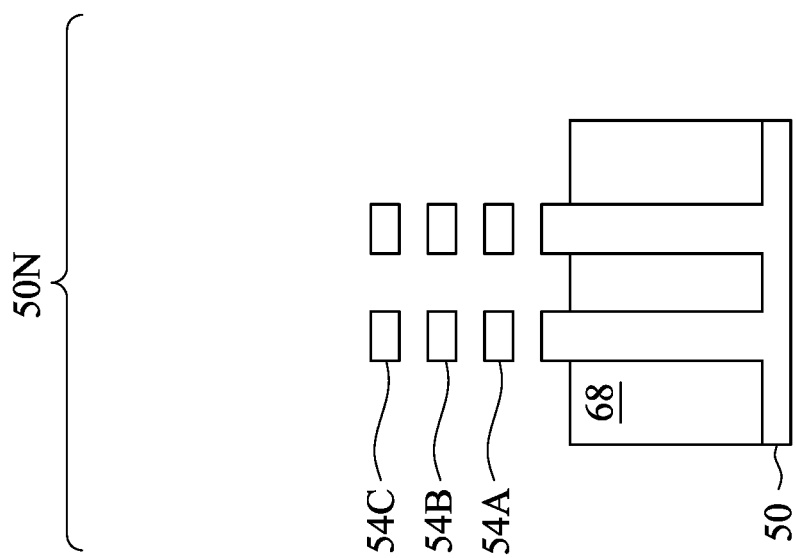
Figure 22B:
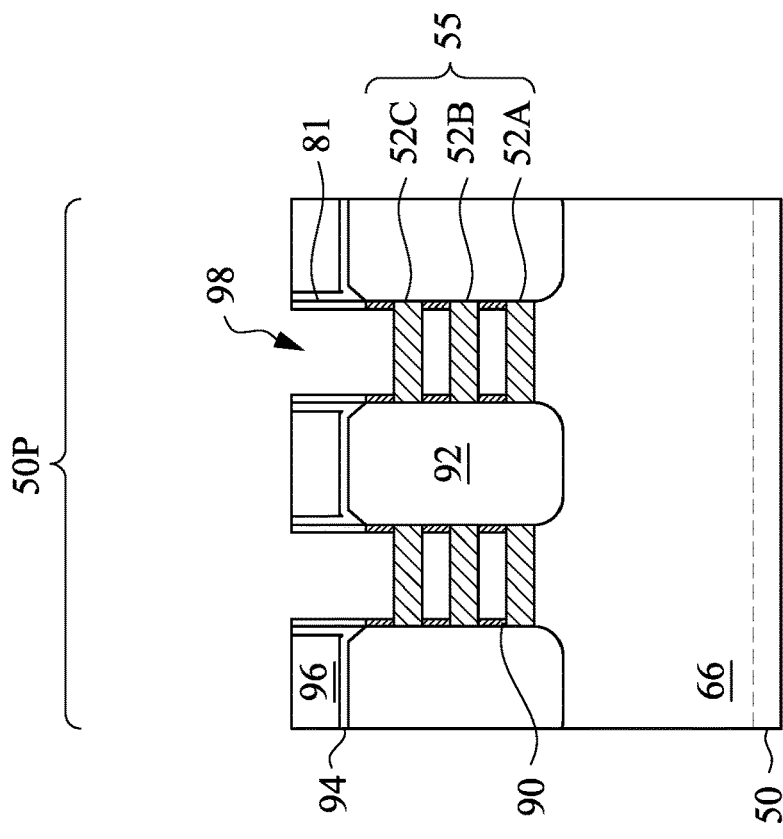
Figure 22B:
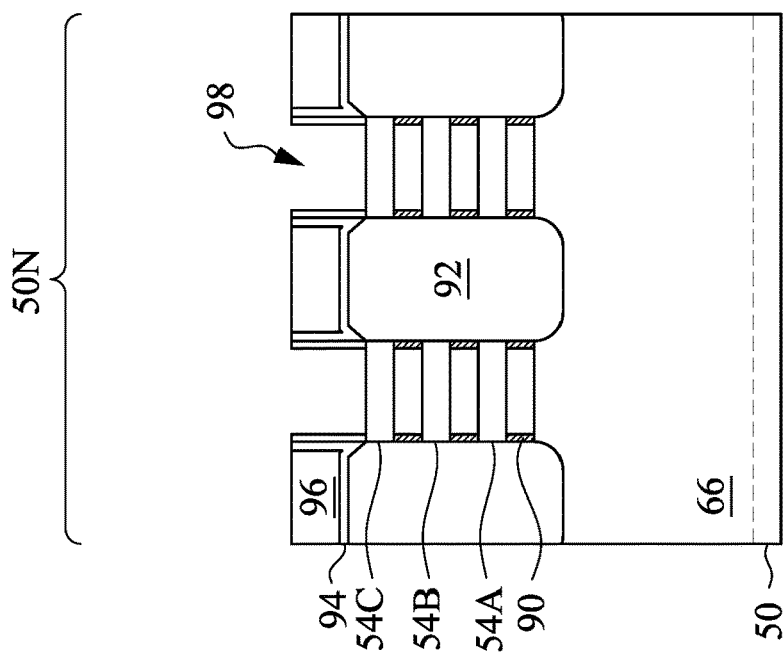

In FIGS. 22A and 22B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETs may have a same material composition, such as silicon, silicon germanium, or the like. FIGS. 27A, 27B, and 27C illustrate a structure resulting from such embodiments where the channel regions in both the p-type region 50P and the n-type region 50N are provided by the second nanostructures 54 and comprise silicon, for example.

Following the removal of the first nanostructures 52 and/or second nanostructures 54, the first inner spacers 90 remain. Due to reducing and/or elimination the lateral seam, the first inner spacers 90 cause an increase in $C_{eff}$ and reduce the chance of shorting between the source/drain regions 92 and the subsequently formed metal gate.

Figure 23A:
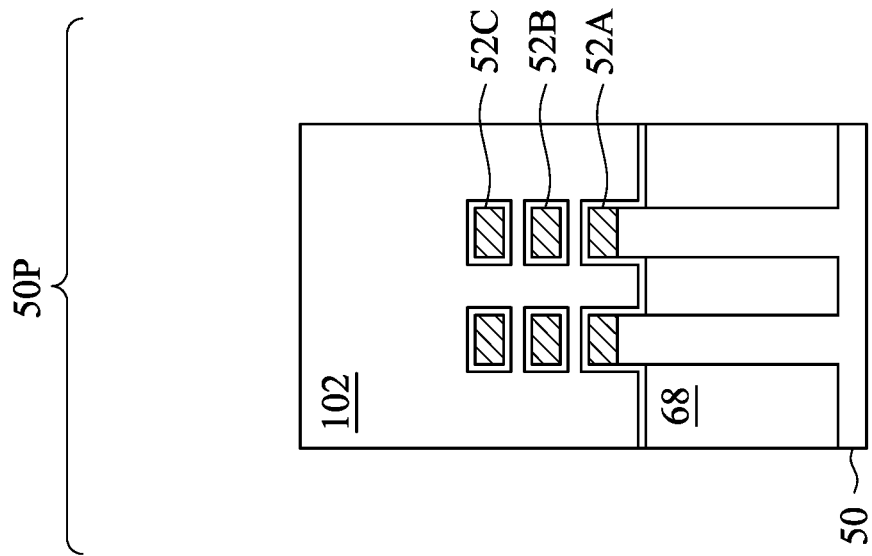
Figure 23A:
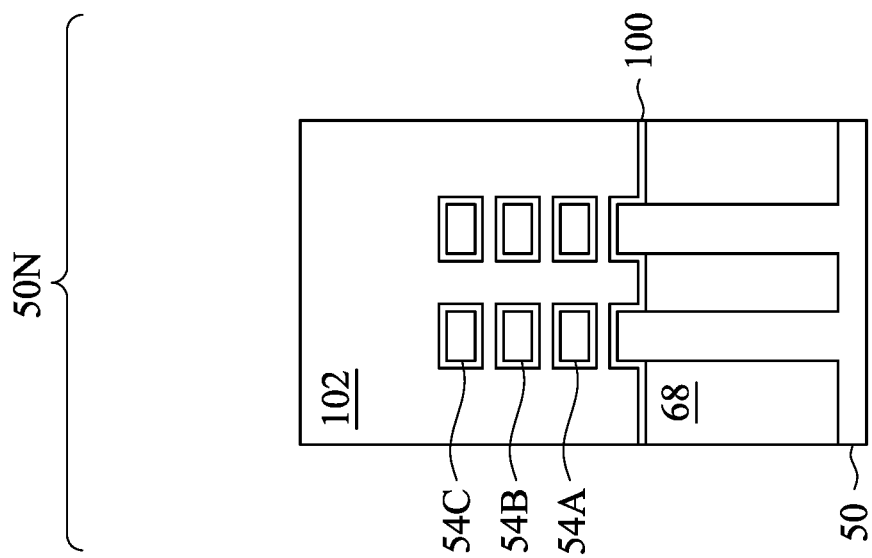
Figure 23B:
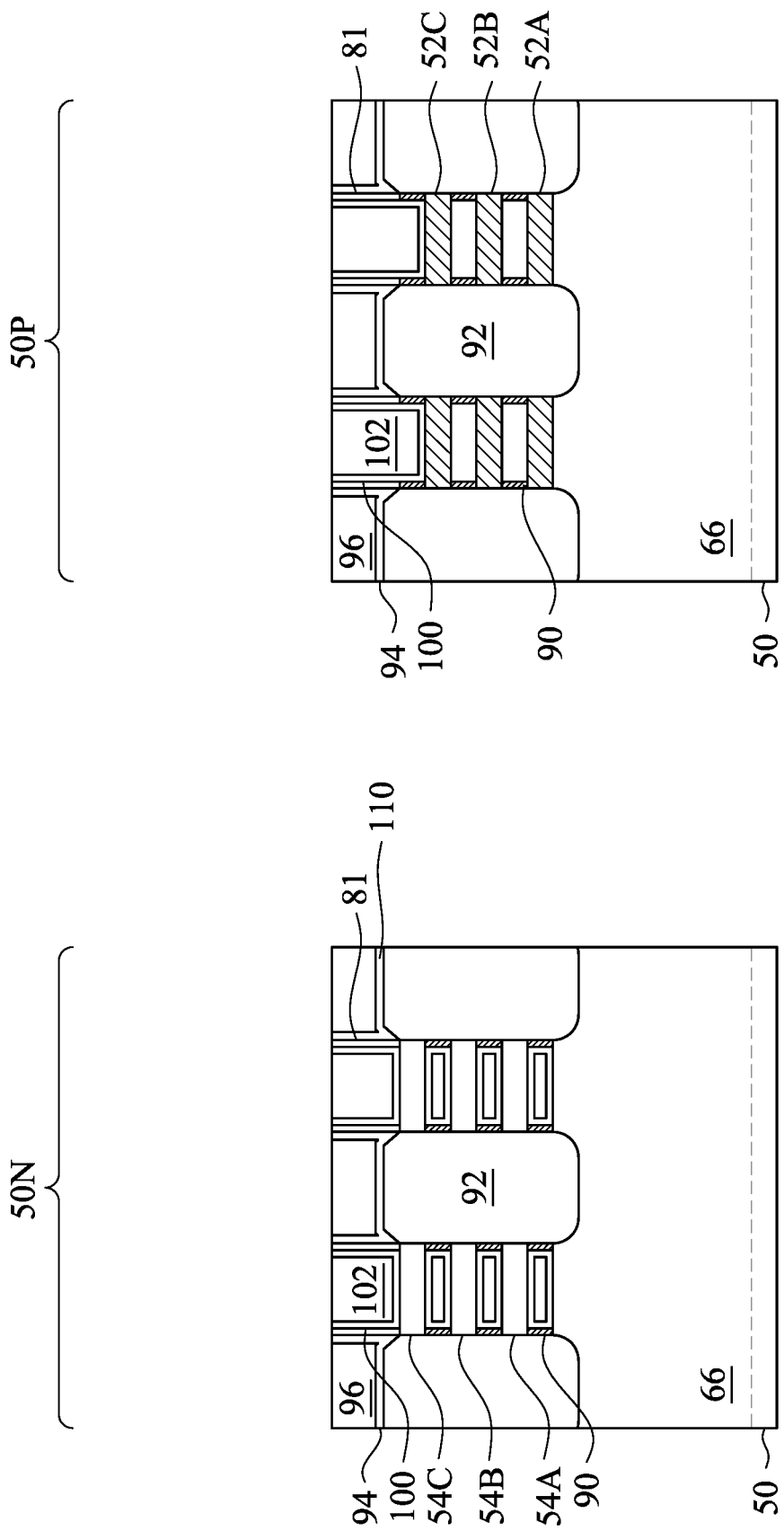

In FIGS. 23A and 23B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52, and along the first inner spacers 90. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 23A and 23B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 24A:
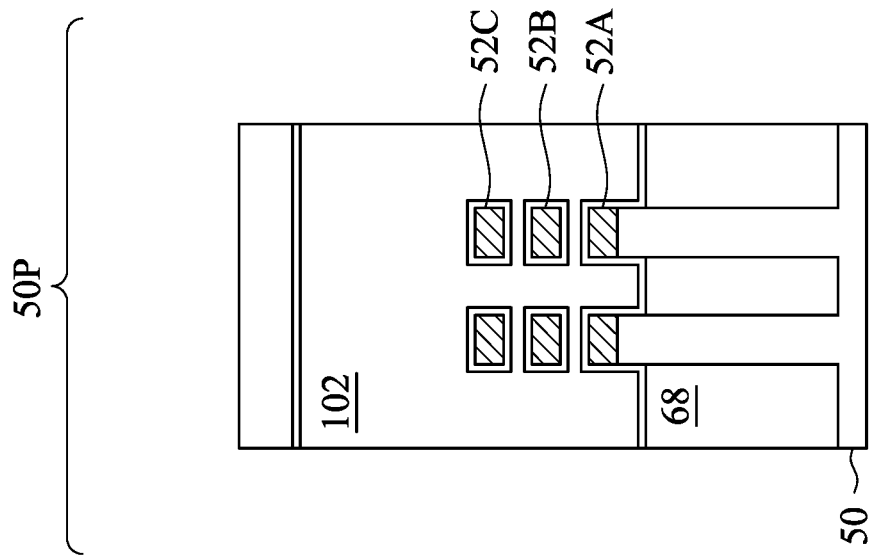
Figure 24A:
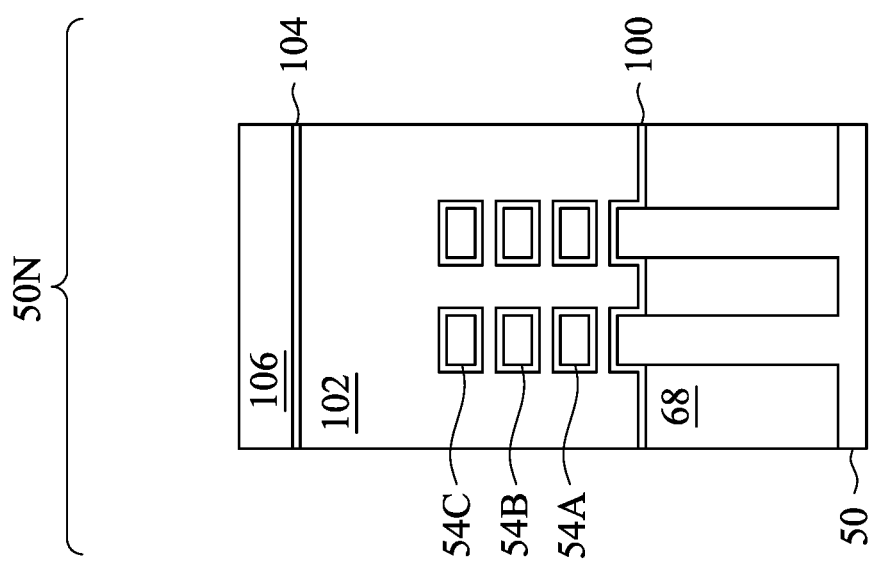
Figure 24B:
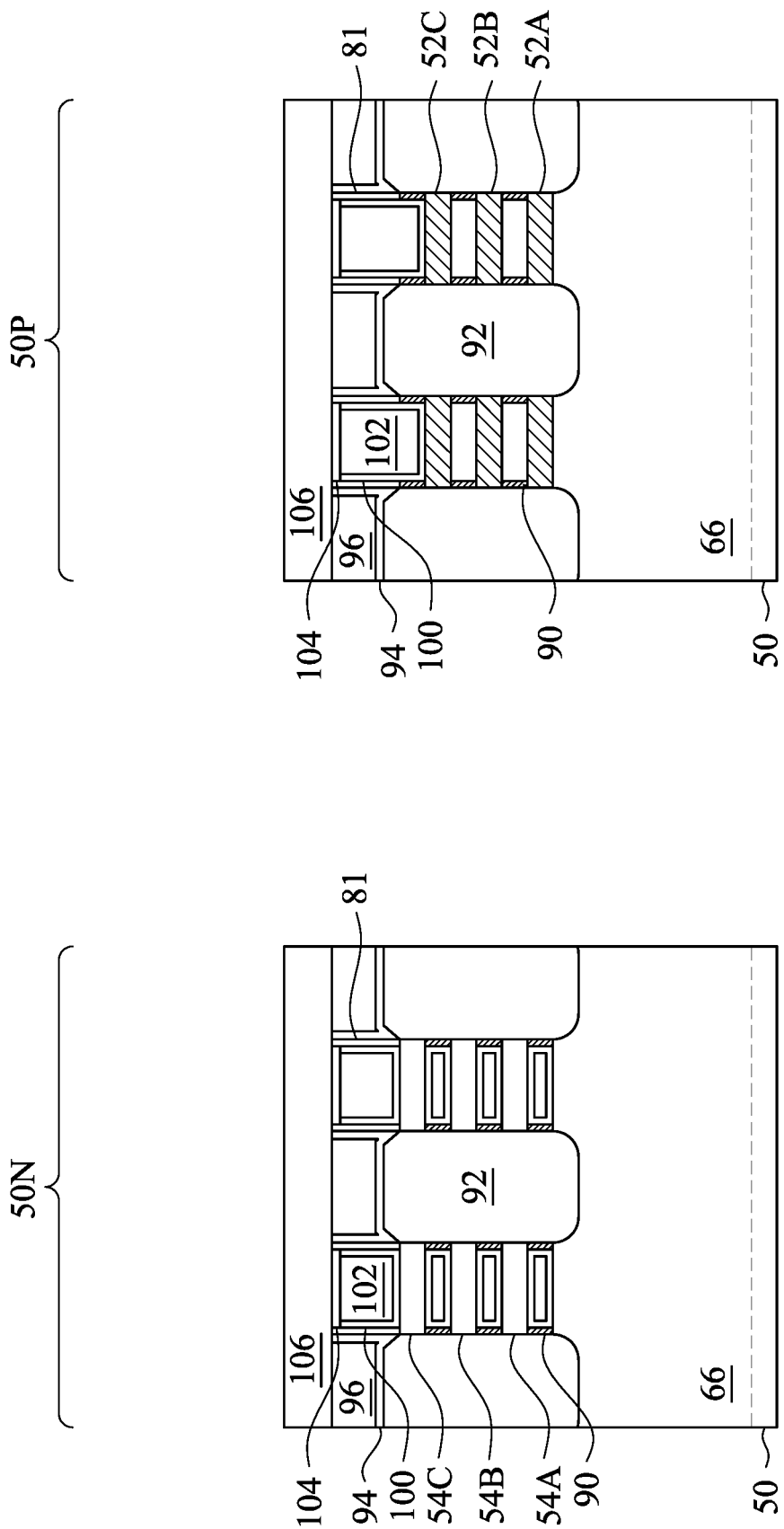
Figure 24C:
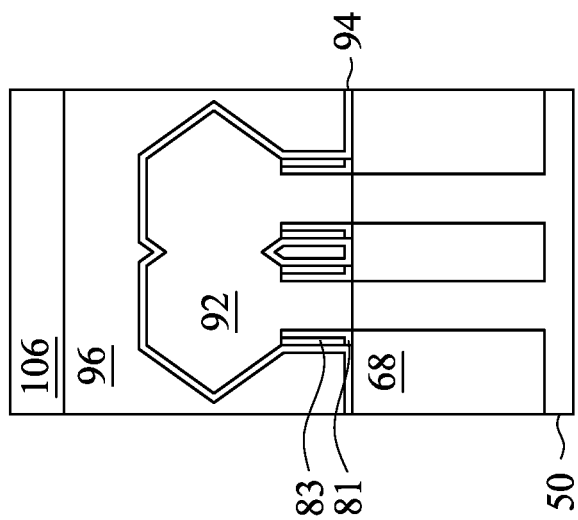

In FIGS. 24A-24C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 26A and 26B) penetrate through the gate mask 104 to contact the top surface of the recessed gate electrodes 102.

As further illustrated by FIGS. 24A-24C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 25A:
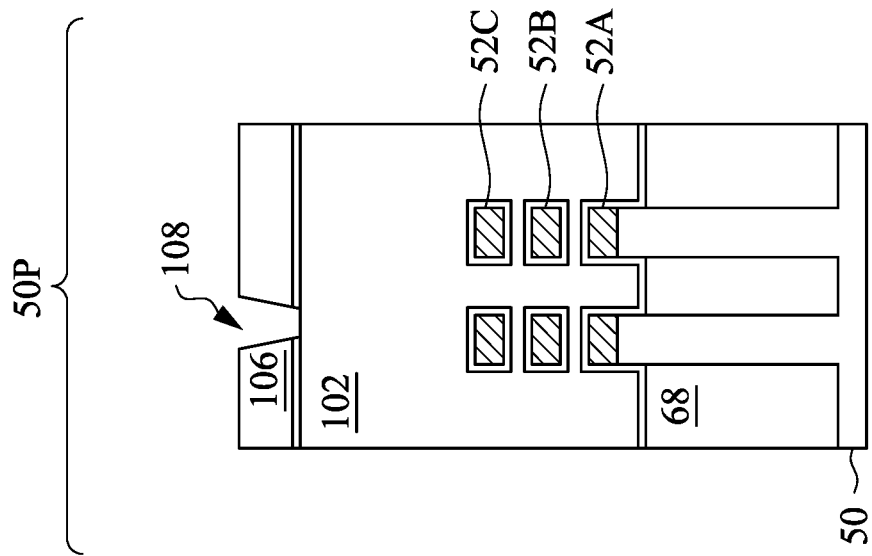
Figure 25A:
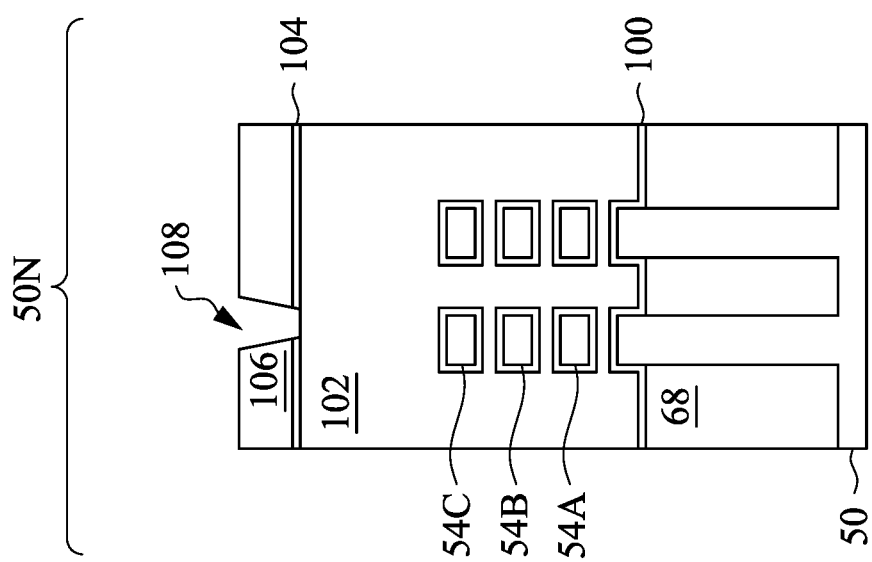
Figure 25B:
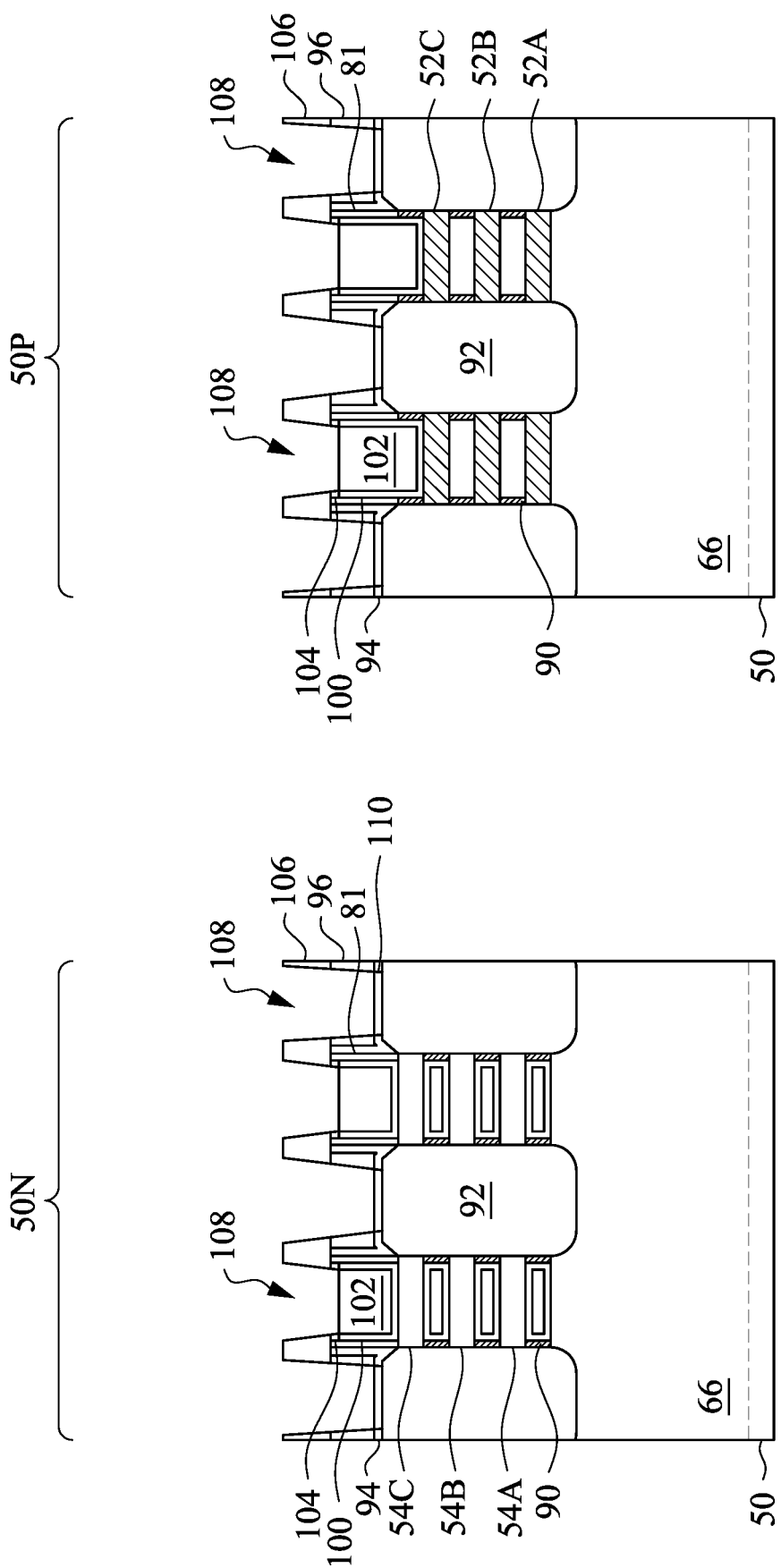
Figure 25C:
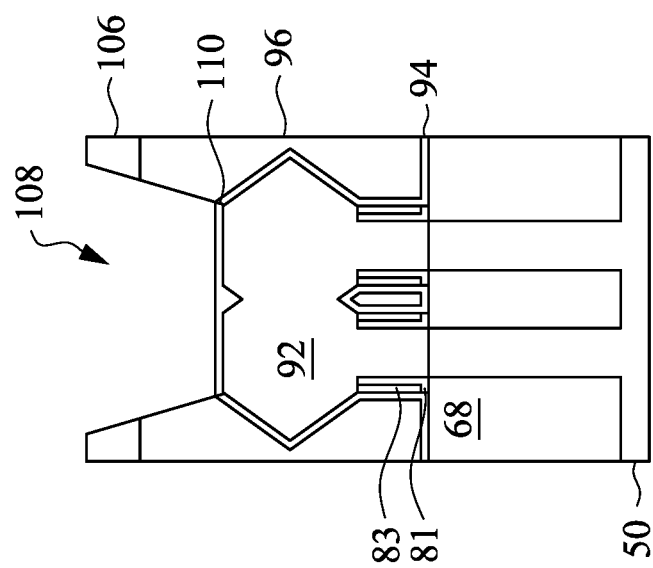

In FIGS. 25A-25C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 25B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 26A:
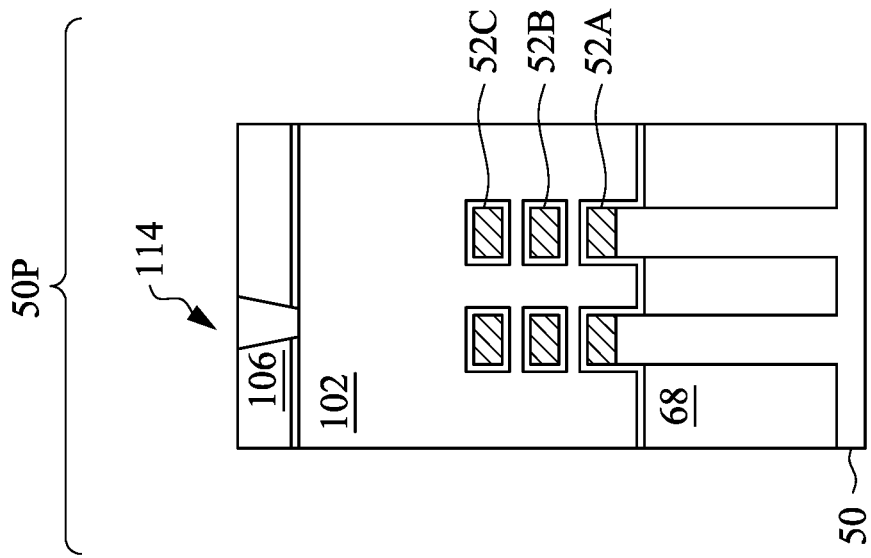
Figure 26A:
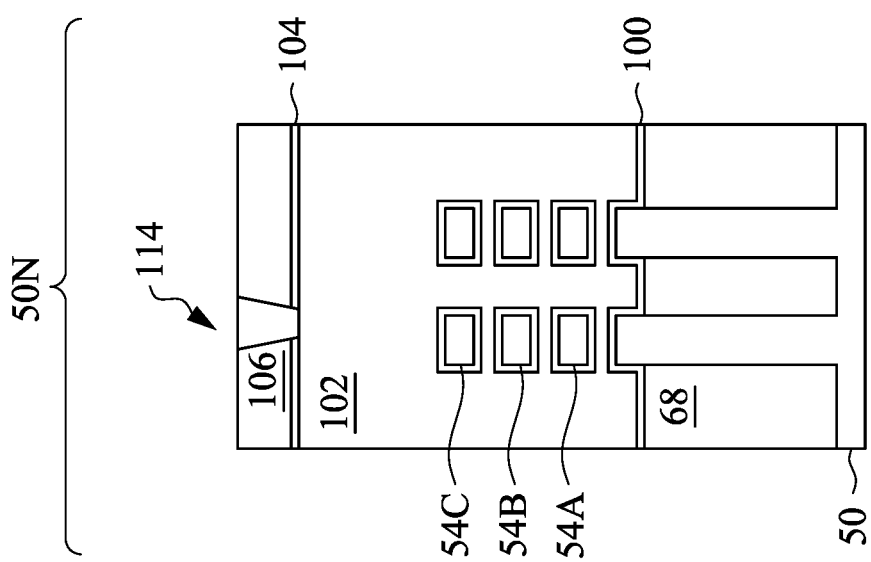
Figure 26B:
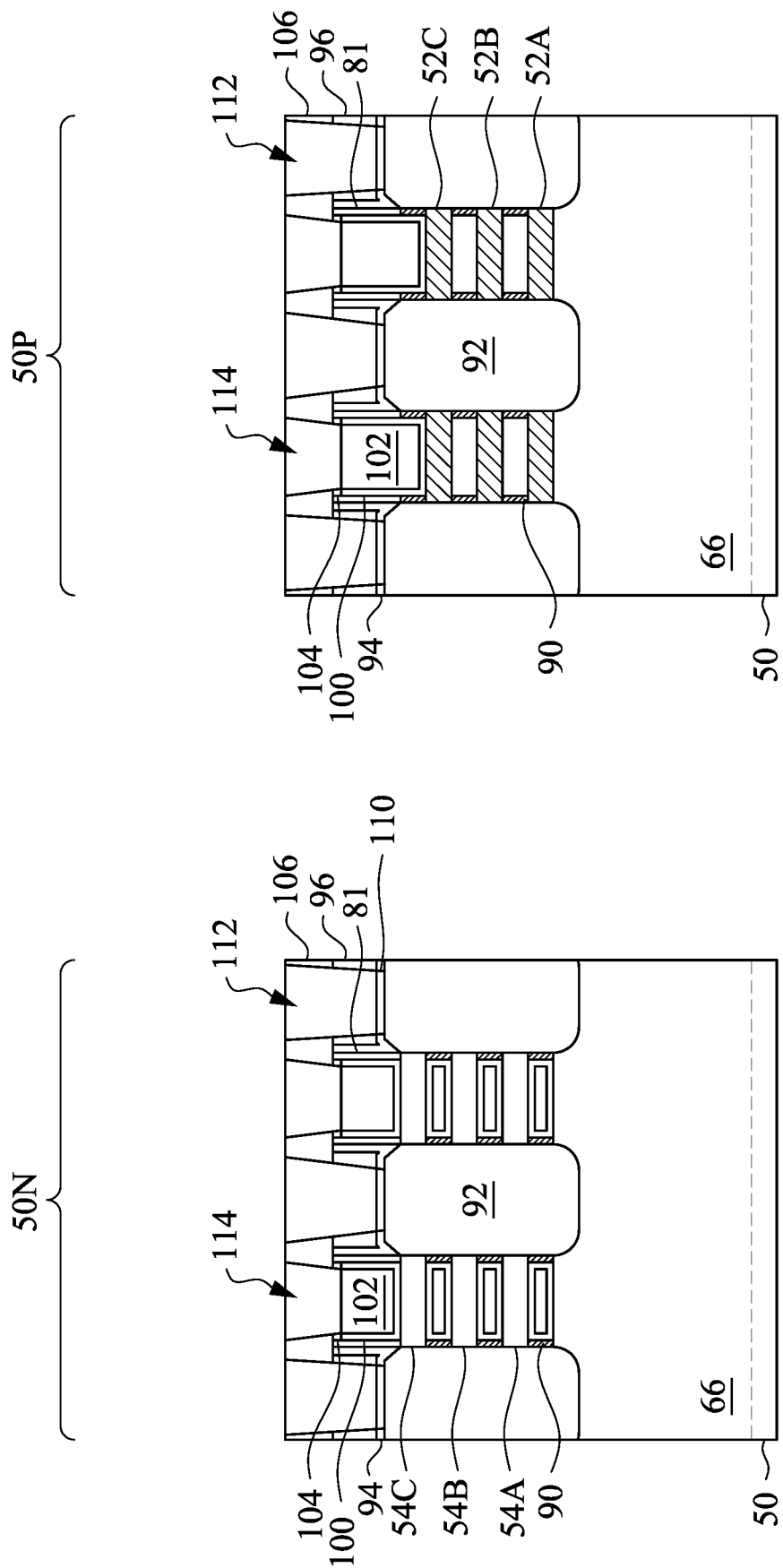
Figure 26C:
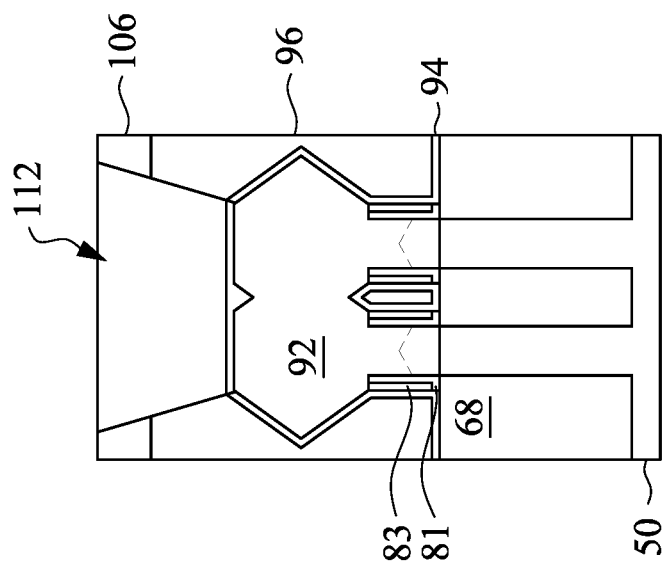
Figure 27A:
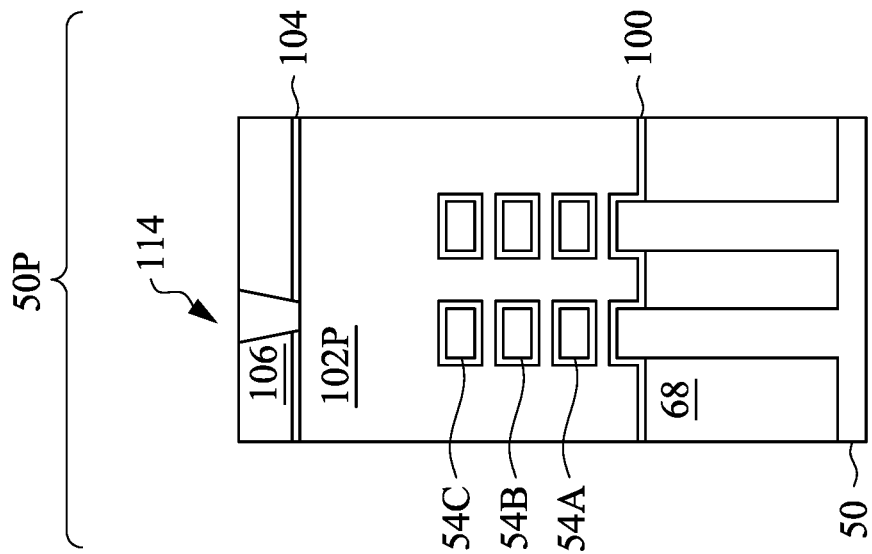
FIGS. 27A, 27B, and 27C are cross-sectional views of a nano-FET, in accordance with some embodiments.
Figure 27A:
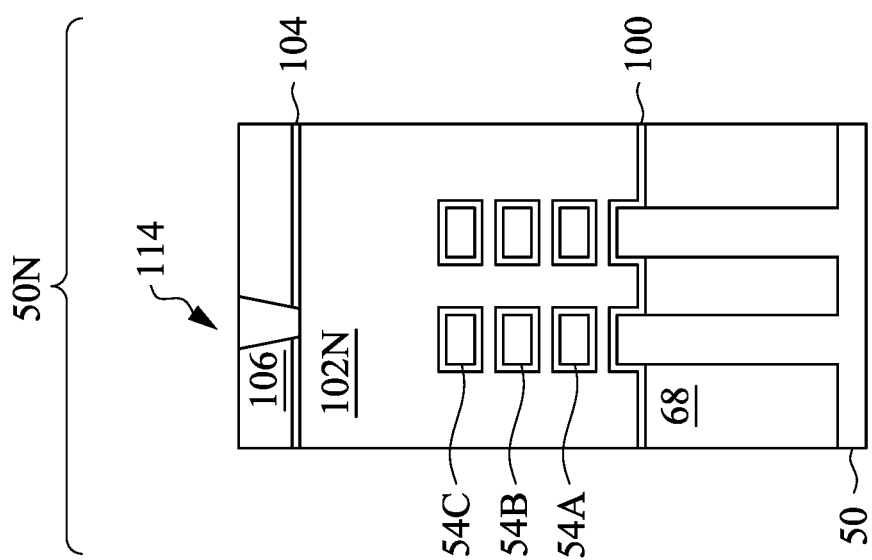
Figure 27B:
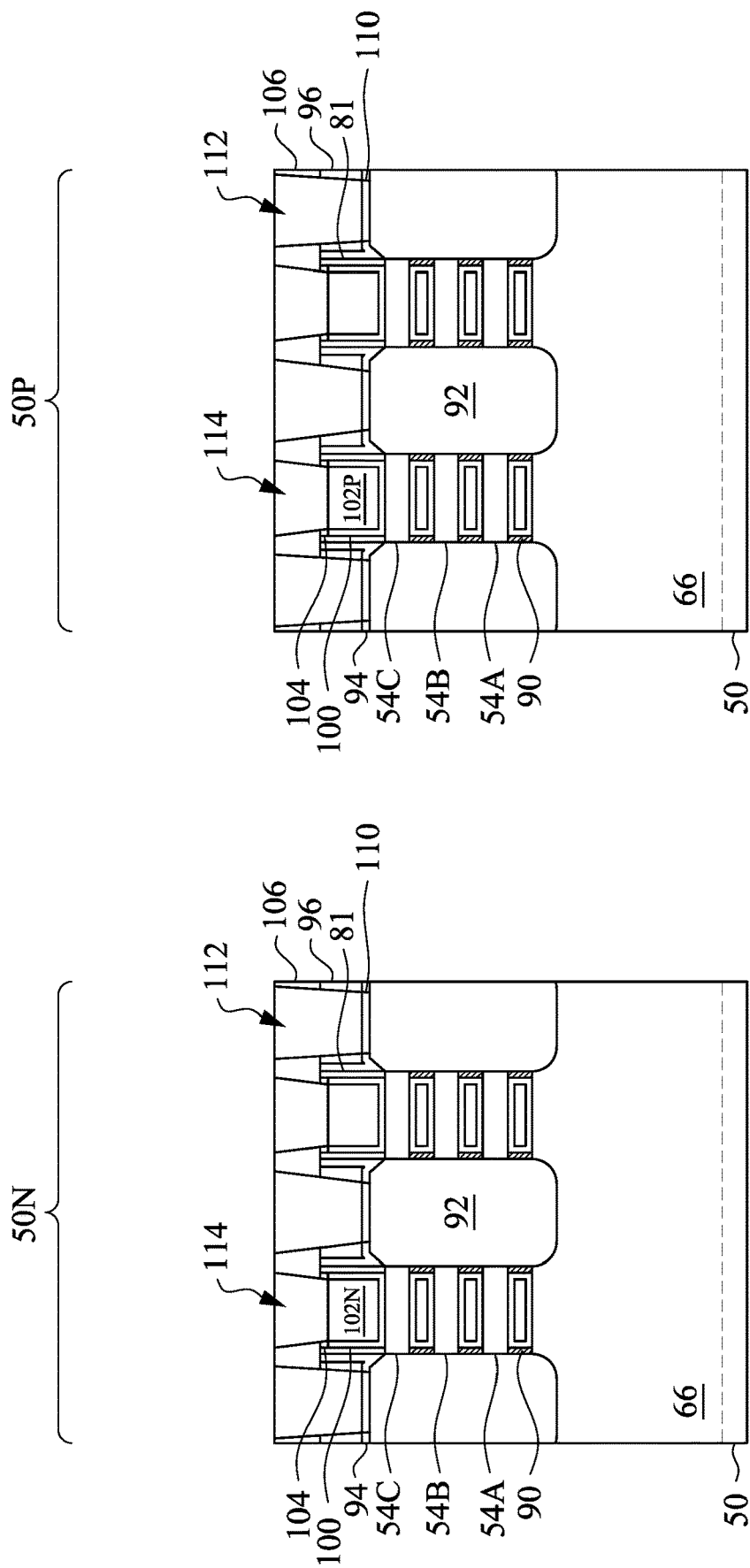
Figure 27C:
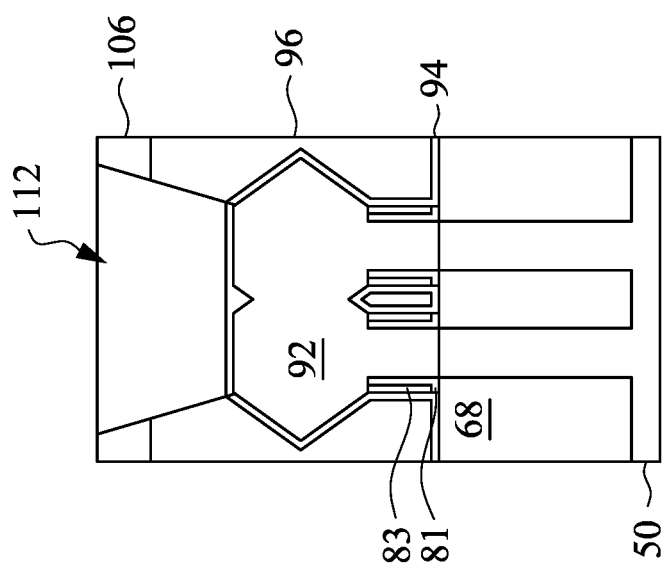

Next, in FIGS. 26A-26C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive fill material, and is electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer for the contacts 112 and 114 may include titanium, titanium nitride, tantalum, tantalum nitride, or the like. The conductive fill material for the contacts 112 and 114 may be copper, a copper alloy, silver, gold, tungsten, cobalt, aluminum, nickel, or the like. A planarization process, such as a CMP, may be performed to remove excess material from a surface of the second ILD 106.

FIGS. 27A-27C illustrate cross-sectional views of a device according to some alternative embodiments. FIG. 27A illustrates reference cross-section A-A' illustrated in FIG. 1. FIG. 27B illustrates reference cross-section B-B' illustrated in FIG. 1. FIG. 27C illustrates reference cross-section C-C' illustrated in FIG. 1. In FIGS. 27A-27C, like reference numerals indicate like elements formed by like processes as the structure of FIGS. 26A-26C. However, in FIGS. 27A-27C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 27A-27C may be formed, for example, by forming inner sidewall spacers on the first nanostructures 52 in both the p-type region 50P and the n-type region 50N; performing the seam closing process of FIGS. 13A through 13D on the inner sidewall spacers; removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments may achieve several advantages. For example, the lateral seam which can result from a conformal deposition process of the spacer layer can be healed by expansion and crosslinking resulting from the oxidation anneal and dry anneal. This reduces the chances of shorting, lowers k-value, and provides better $C_{eff}$ performance of the transistor. Embodiments also infuse oxygen into the spacer layer and provide oxidation of the spacer layer to increase volume and decrease density of the spacer layer. Embodiments also advantageously remove various compounds from the spacer layer including amine groups and methyl groups by conversion into hydroxyl groups, which provide better crosslinking capabilities and more effective insulating properties. The material composition of the spacer layer is altered from the as-deposited state to include a different composition breakdown, which increases oxygen and reduces carbon and nitrogen. Embodiments also reduce the dishing profile of the spacer layer, effectively increasing lateral thickness of the spacer layer.

One embodiment is a device that includes a first nanostructure. The device also includes a second nanostructure over the first nanostructure. The device also includes a source/drain region adjacent the first nanostructure. The device also includes a gate structure surrounding the first nanostructure and the second nanostructure. The device also includes a first inner spacer interposed between the first nanostructure and the second nanostructure, the first inner spacer interposed between the gate structure and the source/drain region, the first inner spacer having oxidation on a first side of the first inner spacer, the first side of the first inner spacer contacting the source/drain region. In an embodiment, the oxidation has a lateral depth between 0 nm and 8 nm. In an embodiment, the oxidation has a gradient of concentration which decreases laterally deeper into the first inner spacer from the first side of the first inner spacer. In an embodiment, a material composition of the first inner spacer includes C at 0-10%, N at 0-20%, O at 30-60%, and Si at 25-40%, by molecular weight. In an embodiment, a material composition of the first inner spacer immediately adjacent the gate structure includes C at 5-15%, N at 10-30%, O at 10-55%, and Si at 30-45%, by molecular weight. In an embodiment, a first side of the first inner spacer has a first curved sidewall, the first side adjacent the gate structure, where a second side of the first inner spacer has a second curved sidewall, the second side opposite the first side, where the second curved sidewall is flatter than the first curved sidewall. In an embodiment, the first inner spacer has a width between 5 nm and 15 nm. In an embodiment, the first inner spacer has a uniform material composition.

Another embodiment is a transistor including a first nanostructure over a semiconductor substrate, the first nanostructure including a first end. The transistor also includes a second nanostructure over the first nanostructure, the second nanostructure including a second end. The transistor also includes a spacer interposed between the first end and the second end. The transistor also includes a gate dielectric surrounding the first nanostructure and the second nanostructure, the gate dielectric having an interface with a first side of the spacer. The transistor also includes a source/drain region adjacent the first end and the second end, the source/drain region having an interface with a second side of the spacer, the second side of the spacer opposite the first side, where the first side of the spacer has a first dishing profile, where the second side of the spacer has a second dishing profile, where the second dishing profile is less dished than the first dishing profile. In an embodiment, the first dishing profile is between 0.5 nm and 15 nm, and the second dishing profile is between 0 nm and 5 nm. In an embodiment, the spacer has a first oxidation concentration disposed at the second side of the spacer. In an embodiment, the first oxidation concentration has a lateral depth from the second side of the spacer greater than 0 nm and less than about 8 nm. In an embodiment, the first oxidation concentration has a concentration gradient which decreases from the second side of the spacer toward the first side of the spacer.

Another embodiment is a method including etching a first recess adjacent a first nanostructure and a second nanostructure, the first nanostructure over the second nanostructure. The method also includes etching, through the first recess, sidewalls of the first nanostructure to form a sidewall recess of the first nanostructure. The method also includes forming a first sidewall spacer in the sidewall recess, the first sidewall spacer having a horizontal seam between an upper portion and a lower portion. The method also includes performing an oxidation anneal, the oxidation anneal infusing the horizontal seam with oxygen. The method also includes performing a dry anneal, the dry anneal causing crosslinking between the upper portion and the lower portion, a size of the horizontal seam reduced by the crosslinking. In an embodiment, the oxidation anneal and the dry anneal a k-value of the first sidewall spacer is reduced by 5% to 10% after the dry anneal. In an embodiment, the oxidation anneal and the dry anneal increase a volume of the first sidewall spacer by 5% to 20%. In an embodiment, the method further includes: depositing a source/drain region in the first recess; etching an opening over the first nanostructure and the second nanostructure; etching to extend the opening to remove the first nanostructure; and depositing a gate structure in the opening and around the second nanostructure, the first sidewall spacer disposed between the gate structure and the source/drain region. In an embodiment, the oxidation anneal is performed at a temperature between 200 C and 600 C in an ambient environment that includes $H_2O$, $CO_2$, $O_2$, $O_3$, O related oxidant species, or combinations thereof. In an embodiment, the dry anneal is performed at a temperature between 500 C and 800 C. In an embodiment, the oxidation anneal and the dry anneal decrease a density of the first sidewall spacer by 5% to 15%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a first recess adjacent a first nanostructure and a second nanostructure, the first nanostructure over the second nanostructure;
   etching, through the first recess, sidewalls of the first nanostructure to form a sidewall recess of the first nanostructure;
   forming a first sidewall spacer in the sidewall recess, the first sidewall spacer having a horizontal seam between an upper portion and a lower portion;
   performing an oxidation anneal, the oxidation anneal infusing the horizontal seam with oxygen; and
   performing a dry anneal, the dry anneal causing crosslinking between the upper portion and the lower portion, a size of the horizontal seam reduced by the crosslinking.

2. The method of claim 1, wherein a k-value of the first sidewall spacer is reduced by 5% to 10% after the oxidation anneal and the dry anneal.

3. The method of claim 1, wherein the oxidation anneal and the dry anneal increase a volume of the first sidewall spacer by 5% to 20%.

4. The method of claim 1, further comprising:
   depositing a source/drain region in the first recess;
   etching an opening over the first nanostructure and the second nanostructure;
   etching to extend the opening to remove the first nanostructure; and
   depositing a gate structure in the opening and around the second nanostructure, the first sidewall spacer disposed between the gate structure and the source/drain region.

5. The method of claim 1, wherein the oxidation anneal is performed at a temperature between 200° C. and 600° C. in an ambient environment that includes $H_2O$, $CO_2$, $O_2$, $O_3$, O related oxidant species, or combinations thereof.

6. The method of claim 1, wherein the dry anneal is performed at a temperature between 500° C. and 800° C.

7. The method of claim 1, wherein the oxidation anneal and the dry anneal decrease a density of the first sidewall spacer by 5% to 15%.

8. A method comprising:
   forming alternating layers of a first material layer and a second material layer;
   etching a first recess and a second recess in the alternating layers of the first material layer and the second material layer to form a stack of nanostructures, the stack of nanostructures including a first nanostructure between a second nanostructure and a third nanostructure;
   recessing a sidewall of a first nanostructure to form a sidewall recess;
   forming a first inner sidewall spacer in the sidewall recess, the first inner sidewall spacer having a horizontal seam between an upper portion and a lower portion of the first inner sidewall spacer in the sidewall recess;
   treating the first inner sidewall spacer to reduce the horizontal seam between the upper portion and the lower portion of the first inner sidewall spacer; and
   replacing the first nanostructure with a gate structure.

9. The method of claim 8, wherein the treating comprises performing an oxidation anneal, the oxidation anneal infusing the horizontal seam with oxygen.

10. The method of claim 9, wherein the treating comprises performing a dry anneal.

11. The method of claim 8, wherein the treating comprises forming an oxidation on a first side of the first inner sidewall spacer.

12. The method of claim 11, wherein the oxidation has a lateral depth between 0 nm and 8 nm.

13. The method of claim 11, wherein the oxidation has a gradient of concentration which decreases laterally deeper into the first inner sidewall spacer from the first side of the first inner sidewall spacer.

14. The method of claim 11, wherein a material composition of the first inner sidewall spacer comprises C at 0-10%, N at 0-20%, O at 30-60%, and Si at 25-40%, by molecular weight.

15. The method of claim 11, wherein a material composition of the first inner sidewall spacer immediately adjacent the gate structure comprises C at 5-15%, N at 10-30%, O at 10-55%, and Si at 30-45%, by molecular weight.

16. A method comprising:
  forming a stack of layers, the stack of layers comprising alternating layers of a first material and a second material;
  etching a first recess in the stack of layers, the etching exposing a sidewall of a first nanostructure layer of the stack of layers;
  recessing the sidewall of a first nanostructure layer to form a sidewall recess;
  forming a first inner sidewall spacer in the sidewall recess, the first inner sidewall spacer having a horizontal seam between an upper portion and a lower portion of the first inner sidewall spacer in the sidewall recess, wherein an outer sidewall of the first inner sidewall spacer having a second recess;
  performing an oxidation anneal;
  after performing the oxidation anneal, performing a dry anneal, wherein after performing the dry anneal, a volume of the first inner sidewall spacer increases and a size of the second recess is reduced;
  forming a source/drain region in the first recess and the second recess; and
  replacing the first nanostructure layer with a gate structure.

17. The method of claim 16, wherein the oxidation anneal is performed at a temperature between 200° C. and 600° C. in an ambient environment that includes $H_2O$, $CO_2$, $O_2$, $O_3$, O related oxidant species, or a combination thereof.

18. The method of claim 16, wherein the dry anneal is performed at a temperature between 500° C. and 800° C.

19. The method of claim 16, wherein the oxidation anneal and the dry anneal decrease a density of the first inner sidewall spacer by 5% to 15%.

20. The method of claim 16, wherein after performing the dry anneal, the second recess has a depth between 0 nm and 5 nm.

* * * * *